United States Patent
Campbell et al.

(10) Patent No.: US 8,387,249 B2
(45) Date of Patent: Mar. 5, 2013

(54) APPARATUS AND METHOD FOR FACILITATING SERVICING OF A LIQUID-COOLED ELECTRONICS RACK

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Poughkeepsie, NY (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1131 days.

(21) Appl. No.: 11/942,221

(22) Filed: Nov. 19, 2007

(65) Prior Publication Data

US 2009/0126910 A1    May 21, 2009

(51) Int. Cl.
  *B21D 53/02* (2006.01)
  *B23P 6/00* (2006.01)
  *F28D 15/00* (2006.01)
  *H01S 4/00* (2006.01)
(52) U.S. Cl. ............... 29/890.031; 29/890.03; 29/592.1; 29/428; 165/104.33; 165/104.28
(58) Field of Classification Search ............. 29/890.031, 29/890.03, 592.1, 428; 165/104.28, 104.31, 165/104.33, 287; 361/701
See application file for complete search history.

(56) References Cited

U.S. PATENT DOCUMENTS

| | | |
|---|---|---|
| 5,056,331 A | 10/1991 | Lotz |
| 5,428,897 A | 7/1995 | Jordan et al. |
| 5,896,922 A | 4/1999 | Chrysler et al. |
| 6,108,899 A | 8/2000 | Piccirilli |
| 6,374,627 B1 | 4/2002 | Schumacher et al. |
| 6,494,050 B2 | 12/2002 | Spinazzola et al. |
| 6,587,343 B2 | 7/2003 | Novotny et al. |
| 6,745,579 B2 | 6/2004 | Spinazzola et al. |
| 6,746,212 B2 | 6/2004 | Payne |
| 6,748,656 B2 | 6/2004 | Woerner et al. |

(Continued)

OTHER PUBLICATIONS

Campbell et al., "Coolant Control Unit, and Cooled Electronics System and Method Employing the Same", U.S. Appl. No. 11/427,465, filed Jun. 29, 2006.

(Continued)

*Primary Examiner* — David P Bryant
*Assistant Examiner* — Alexander P Taousakis
(74) *Attorney, Agent, or Firm* — Dennis Jung, Esq.; Kevin P. Radigan, Esq.; Heslin Rothenberg Farley & Mesiti P.C.

(57) ABSTRACT

Apparatus and method for facilitating servicing of a liquid-cooled electronics rack are provided. The apparatus includes a coolant tank, a coolant pump in fluid communication with the coolant tank, multiple parallel-connected coolant supply lines coupling the coolant pump to a coolant supply port of the apparatus, and a coolant return port and a coolant return line coupled between the coolant return port and the coolant tank. Each coolant supply line includes a coolant control valve for selectively controlling flow of coolant therethrough pumped by the coolant pump from the coolant tank. At least one coolant supply line includes at least one filter, and one coolant supply line is a bypass line with no filter. When operational, the apparatus facilitates filling of coolant into a cooling system of a liquid-cooled electronics rack by allowing for selective filtering of coolant inserted into the cooling system.

15 Claims, 20 Drawing Sheets

U.S. PATENT DOCUMENTS

| | | | |
|---|---|---|---|
| 6,763,880 B1 | 7/2004 | Shih | |
| 6,775,137 B2 | 8/2004 | Chu et al. | |
| 6,826,922 B2 | 12/2004 | Patel et al. | |
| 6,854,284 B2 | 2/2005 | Bash et al. | |
| 6,854,287 B2 | 2/2005 | Patel et al. | |
| 6,896,612 B1 | 5/2005 | Novotny | |
| 6,924,981 B2 | 8/2005 | Chu et al. | |
| 6,927,980 B2 | 8/2005 | Fukuda et al. | |
| 6,992,382 B2 | 1/2006 | Chrysler et al. | |
| 7,002,799 B2 | 2/2006 | Malone et al. | |
| 7,011,143 B2 | 3/2006 | Corrado et al. | |
| 7,104,081 B2 | 9/2006 | Chu et al. | |
| 7,106,590 B2 | 9/2006 | Chu et al. | |
| 7,110,260 B2 | 9/2006 | Weber et al. | |
| 7,120,021 B2 | 10/2006 | Hamman | |
| 7,187,549 B2 | 3/2007 | Teneketges et al. | |
| 7,203,063 B2 | 4/2007 | Bash et al. | |
| 7,236,363 B2 | 6/2007 | Belady | |
| 7,272,006 B2 | 9/2007 | Mongia et al. | |
| 7,280,363 B2 | 10/2007 | Reyzin et al. | |
| 7,315,448 B1 | 1/2008 | Bash et al. | |
| 7,318,322 B2 | 1/2008 | Ota et al. | |
| 7,342,789 B2 | 3/2008 | Hall et al. | |
| 7,380,409 B2 | 6/2008 | Campbell et al. | |
| 7,397,661 B2 | 7/2008 | Campbell et al. | |
| 7,400,505 B2 | 7/2008 | Campbell et al. | |
| 7,447,022 B2 | 11/2008 | Murakami et al. | |
| 7,447,026 B2 * | 11/2008 | Murakami et al. | 361/696 |
| 7,486,516 B2 | 2/2009 | Colbert et al. | |
| 7,534,167 B2 | 5/2009 | Day | |
| 7,551,440 B2 | 6/2009 | Belady et al. | |
| 7,641,101 B2 | 1/2010 | Campbell et al. | |
| 7,757,506 B2 | 7/2010 | Ellsworth, Jr. et al. | |
| 2003/0001468 A1 | 1/2003 | Hase et al. | |
| 2003/0183562 A1 * | 10/2003 | Pahl et al. | 210/103 |
| 2004/0221604 A1 | 11/2004 | Ota et al. | |
| 2005/0061541 A1 | 3/2005 | Belady | |
| 2005/0225936 A1 | 10/2005 | Day | |
| 2005/0237716 A1 | 10/2005 | Chu et al. | |
| 2006/0002086 A1 | 1/2006 | Teneketges et al. | |
| 2006/0126296 A1 | 6/2006 | Campbell et al. | |
| 2006/0232945 A1 | 10/2006 | Chu et al. | |
| 2006/0250770 A1 | 11/2006 | Campbell et al. | |
| 2007/0019380 A1 | 1/2007 | Campbell et al. | |
| 2007/0227710 A1 | 10/2007 | Belady et al. | |
| 2008/0024991 A1 | 1/2008 | Colbert et al. | |
| 2008/0034761 A1 * | 2/2008 | Hartley | 62/67 |
| 2008/0158815 A1 | 7/2008 | Campbell et al. | |
| 2009/0086428 A1 | 4/2009 | Campbell et al. | |
| 2009/0086432 A1 | 4/2009 | Campbell et al. | |
| 2010/0236772 A1 * | 9/2010 | Novotny et al. | 165/287 |

OTHER PUBLICATIONS

Campbell et al., "Methods for Configuring Tubing for Interconnecting In-Series Multiple Liquid-Cooled Cold Plates", U.S. Appl. No. 11/620,088, filed Jan. 5, 2007.

Campbell et al., "System and Method of Facilitating Cooling of Electronics Racks of a Data Center Employing Multiple Cooling Stations", U.S. Appl. No. 11/744,269, filed May 4, 2007.

Notice of Allowance for U.S. Appl. No. 11/862,346 (U.S. Patent Publication No. 2009/0086428 A1), dated Sep. 17, 2009.

Office Action for U.S. Appl. No. 11/862,328 (U.S. Patent Publication No. 2009/0086432 A1), dated Oct. 20, 2009.

Office Action for U.S. Appl. No. 11/862,328 (U.S. Patent Publication No. 2009/0086432 A1), dated Mar. 24, 2010.

Notice of Allowance for U.S. Letters Patent No. 7,757,506 B2, dated Mar. 15, 2010.

D. Delia et al., "System Cooling Design for the Water-Cooled IBM Enterprise System/900 Processors", IBM Journal of Research and Development, vol. 26, No. 4, pp. 791-803 (Jul. 1992).

* cited by examiner

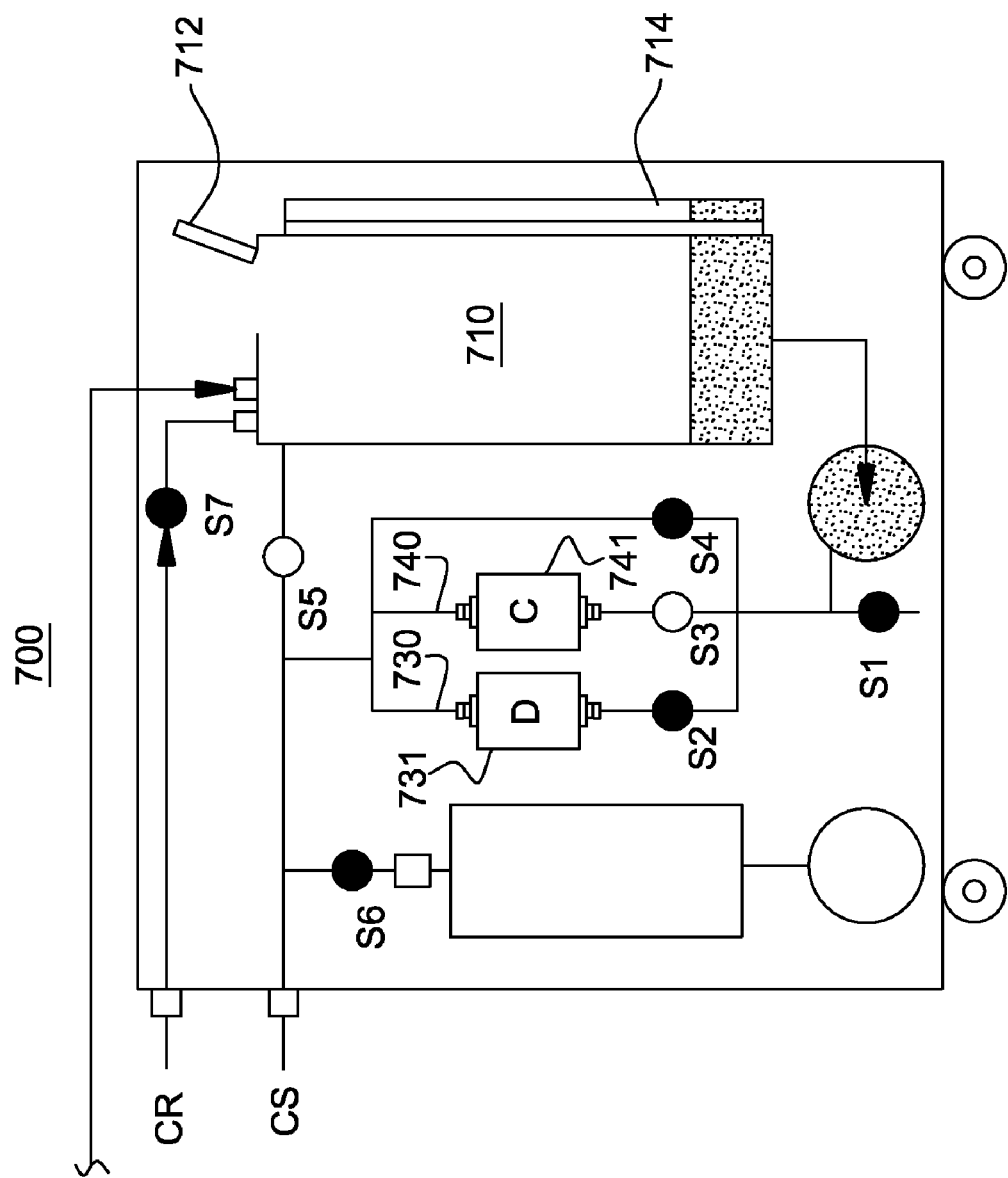
FIG. 8

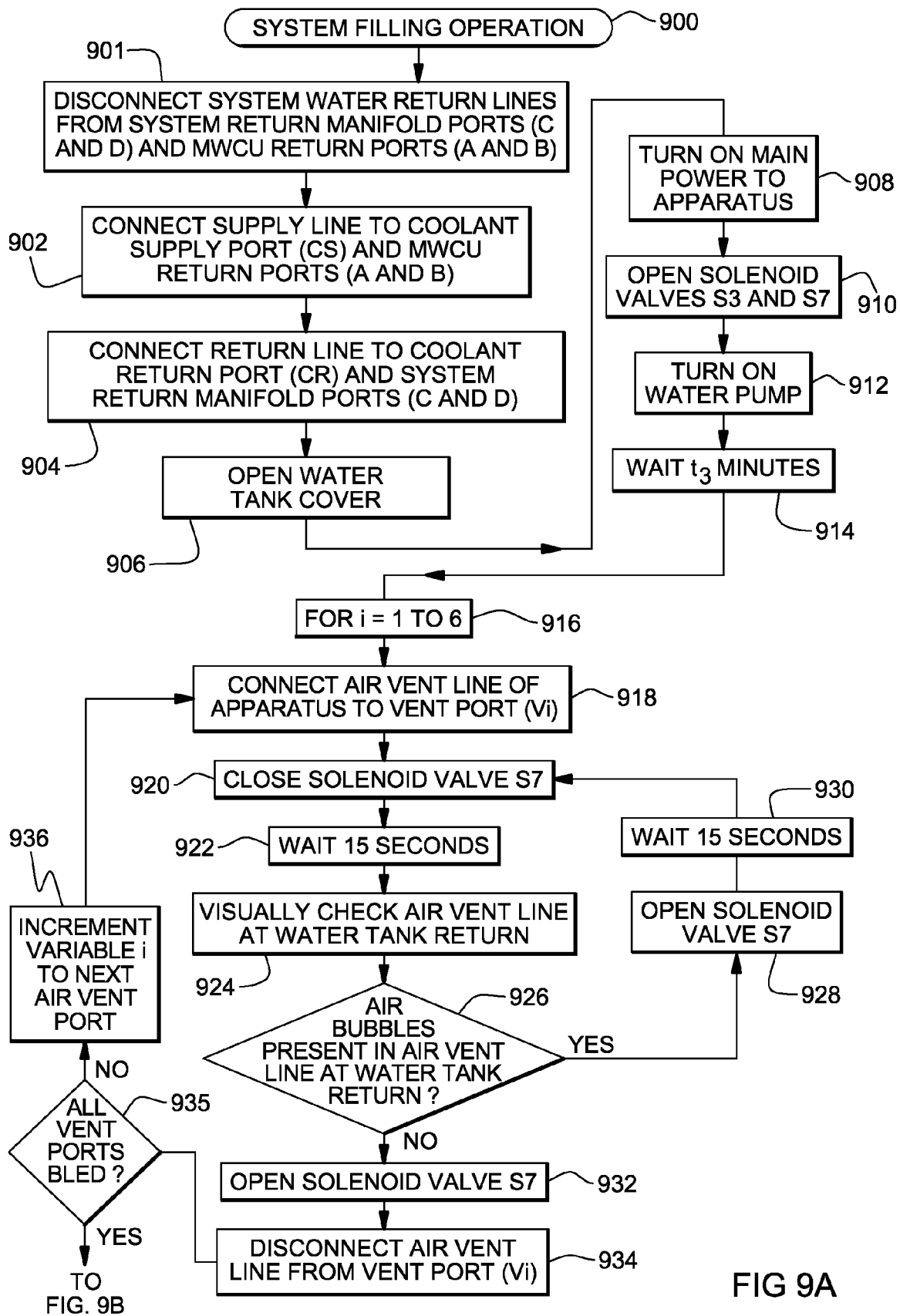

APPARATUS AND METHOD FOR FACILITATING SERVICING OF A LIQUID-COOLED ELECTRONICS RACK

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Docking Station with Closed Loop Airflow Path for Facilitating Cooling of an Electronics Rack", by Campbell et al., U.S. patent application Ser. No. 11/862,328, filed Sep. 27, 2007, which was published on Apr. 2, 2009, as U.S. Patent Publication No. 2009/0086432 A1;

"Docking Station with Hybrid Air and Liquid Cooling of an Electronics Rack", by Campbell et al., U.S. patent application Ser. No. 11/862,346, filed Sep. 27, 2007, which was published on Apr. 2, 2009, as U.S. Patent Publication No. 2009/0086428 A1; and "System and Method for Facilitating Cooling of a Liquid-Cooled Electronics Rack", by Ellsworth, Jr., et al., U.S. patent application Ser. No. 11/942,207, filed Nov. 19, 2007, which issued Jul. 20, 2010, as U.S. Pat. No. 7,757,506 B2.

TECHNICAL FIELD

The present invention relates in general to apparatuses and methods for facilitating servicing of liquid-cooled, rack-mounted assemblages of individual electronics units, such as rack-mounted computer server units.

BACKGROUND OF THE INVENTION

The power dissipation of integrated circuit chips, and the modules containing the chips, continues to increase in order to achieve increases in processor performance. This trend poses a cooling challenge at both module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the availability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or liquid cooled.

SUMMARY OF THE INVENTION

In one implementation, the large coolant distribution unit (CDU) of prior liquid-cooling approaches is eliminated, and replaced by one or more modular water cooling units (MWCUs) disposed within each server rack to be cooled. This results in a denser placement of server racks within the data center, and more effective utilization of floor space. At the same time, incorporation of the MWCUs at the bottom (for example) of a server rack makes filling and draining of coolant a more challenging problem. Earlier CDUs were much larger in size and contained a coolant reservoir/expansion tank that was large enough in size to contain enough liquid to fill all the pipes and cold plates in a system by filling the CDU expansion tank and pumping the coolant into the system piping and cold plates. In addition, ports in the top of the expansion tank were readily accessible to add liquid as required. Because of the location (e.g., at the bottom of an electronics rack) and small volume of the coolant reservoir within an MWCU, it is difficult to fill the pipes and cold plates of the cooling system by simply adding coolant to an opening in the top of the MWCU.

Thus, provided herein in one aspect, is a method of servicing a cooling system of a liquid-cooled electronics rack is provided. The method includes filling a cooling system of a liquid-cooled electronics rack employing a coolant servicing apparatus. The electronics rack includes at least one electronics subsystem cooled by the cooling system, and the cooling system employs liquid coolant and includes multiple air-vent ports. The coolant servicing apparatus includes: a coolant tank; a coolant pump in fluid communication with the coolant tank for pumping coolant therefrom; at least one coolant supply line coupling the coolant pump to a coolant supply port of the apparatus, each coolant supply line of the at least one coolant supply line including a coolant control valve for selectively controlling flow of coolant therethrough pumped by the coolant pump from the coolant tank to the coolant supply port of the apparatus; a coolant return port, and a coolant return line coupled between the coolant return port and the coolant tank, the coolant return line including a coolant control valve for controlling flow of return coolant therethrough; and an air-vent line connected to an upper portion of the coolant tank, the air-vent line including a flexible tube sized to allow selective coupling thereof to an air-vent port of the multiple air-vent ports of the cooling system of the electronics rack. The filling includes employing the coolant servicing apparatus to fill the cooling system, the employing including: connecting the air-vent line to one vent port of the multiple air-vent ports of the cooling system; closing the coolant control valve of the coolant return line; pumping coolant via the coolant supply port into the cooling system; waiting at least a first period of time; determining whether air is present in the air-vent line, and if so, opening the coolant control valve and the coolant return line to allow coolant to circulate back to the coolant servicing apparatus from the cooling system through the coolant return port, and waiting at least a second period of time before again closing the coolant control valve of the coolant return line to prevent coolant return into the coolant tank therethrough, again waiting at least the first period of time, and checking to determine whether air is present in the air-vent line, and if so, repeating the determining; otherwise, opening the coolant control valve in the coolant return line to allow return of coolant from the cooling system into the coolant tank therethrough, and disconnecting the air-vent line from the one air-vent port of the multiple air-vent ports of the cooling system of the electronics rack, and connecting the air vent line to another air-vent port of the multiple air-vent ports of the cooling system; and repeating the closing, the waiting, the determining, the opening, the disconnecting, and the connecting until each air-vent port of the multiple air-vent ports of the cooling system has been bled of air, thereby facilitating filling of coolant into the cooling system of the liquid-cooled electronics rack.

In a further aspect, a method of servicing a cooling system of a liquid-cooled electronics rack is provided. The method includes: obtaining a coolant servicing apparatus, which includes: a coolant tank; a coolant pump in fluid communication with the coolant tank for pumping coolant therefrom; at least one coolant supply line coupling the coolant pump to a coolant supply port of the apparatus, each coolant supply line of the at least one coolant supply line including a coolant control valve for controlling flow of coolant therethrough pumped by the coolant pump from the coolant tank to the coolant supply port of the apparatus; a coolant return port, and a coolant return line coupled between the coolant return port and the coolant tank, the coolant return line including a coolant return valve for controlling flow of return coolant therethrough; and a pressurized air source connected for selective provision of air flow to the coolant supply port of the apparatus for facilitating draining of coolant from the cooling system of the liquid-cooled electronics rack using the apparatus. The method further includes employing the coolant servicing apparatus to one of fill a cooling system of a liquid-cooled electronics rack, or drain the cooling system of the liquid-cooled electronics rack, wherein filling the cooling system includes connecting at least one first port of the cooling system to the coolant supply port of the coolant servicing apparatus and connecting at least one second port of the cooling system to the coolant return port of the coolant servicing apparatus, and pumping coolant via the coolant supply port into the cooling system and back to the coolant return port for a period of time sufficient to ensure filling of the cooling system with coolant, and wherein draining coolant from the cooling system comprises connecting the at least one first port of the cooling system to the coolant supply port of the coolant servicing apparatus and connecting the at least one second port of the cooling system to the coolant return port of the coolant servicing apparatus and employing the pressurized air source to force air via the coolant supply port into the cooling system for a period of time sufficient to drain a majority of coolant from the cooling system.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 8 is a schematic of the coolant servicing apparatus of FIG. 7, illustrating filling of the coolant servicing apparatus, in accordance with an aspect of the present invention;

FIGS. 9A, 9B & 9C are a flowchart of one embodiment of a protocol for filling the cooling system of FIG. 6 employing the coolant servicing apparatus of FIG. 7, in accordance with an aspect of the present invention;

DETAILED DESCRIPTION OF THE INVENTION

Figure 1:
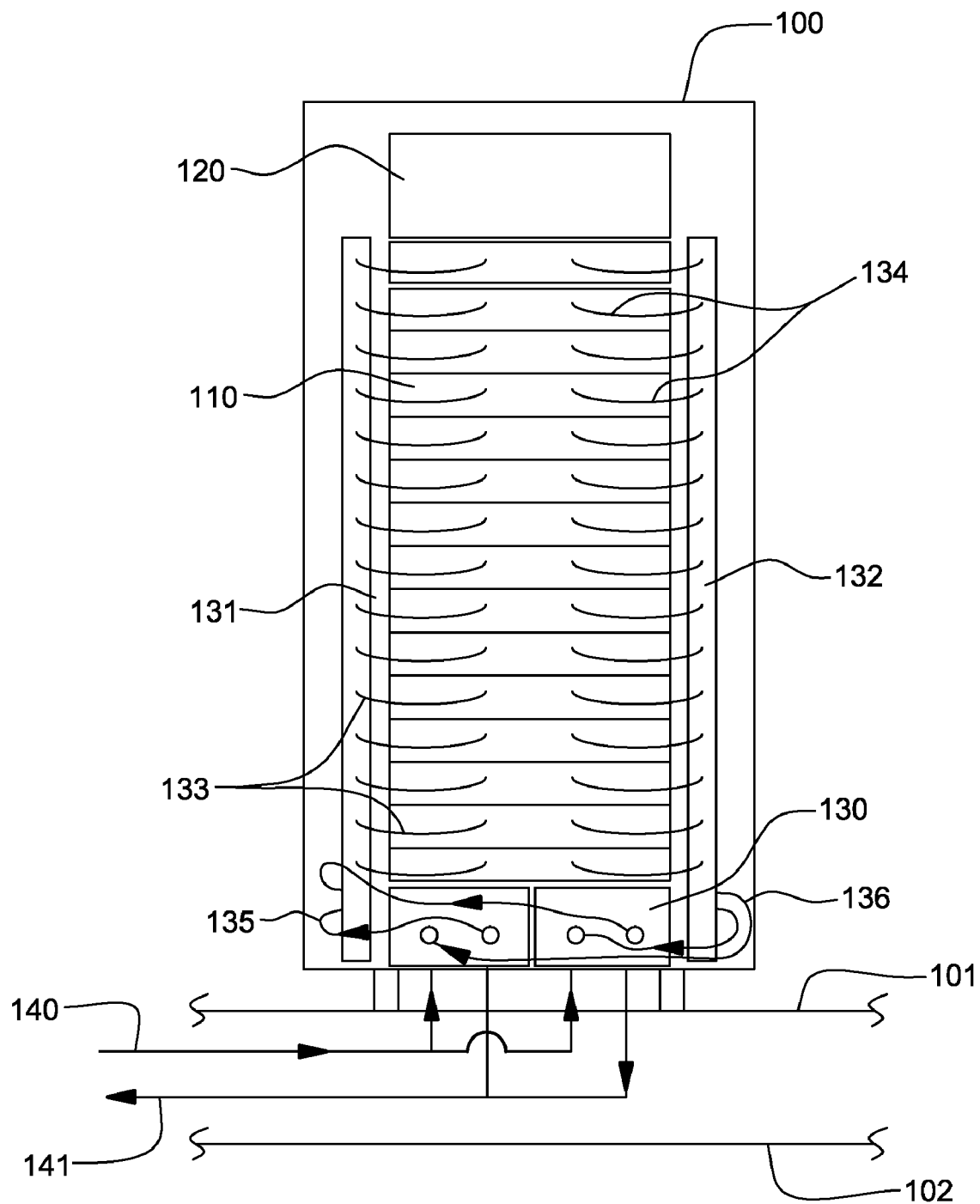
FIG. 1 is a front elevational view of one embodiment of a liquid-cooled electronics rack comprising multiple electronics subsystems cooled by a cooling system to be serviced employing an apparatus and method in accordance with an aspect of the present invention.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the rack-mounted electronics drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. As used herein, "primary heat generating component" refers to a primary heat generating electronic component within an electronics subsystem, while "secondary heat generating component" refers to an electronic component of the electronics subsystem generating less heat than the primary heat generating component to be cooled. "Primary heat generating die" refers, for example, to a primary heat generating die or chip within a heat generating electronic component comprising primary and secondary heat generating dies (with a processor die being one example). "Secondary heat generating die" refers to a die of a multi-die electronic component generating less heat than the primary heat generating die thereof (with memory dies and memory support dies being examples of secondary dies to be cooled). As one example, a heat generating electronic component could comprise multiple primary heat generating bare dies and multiple secondary heat generating dies on a common carrier. Further, unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

As used herein, "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchange assembly and/or air-to-liquid heat exchanger thereof can vary without departing from the scope of the invention disclosed herein. A "liquid-to-liquid heat exchanger" may comprise, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention.

Reference is made below to the drawings, which are not drawn to scale for reasons of understanding, wherein the same reference numbers used throughout different figures designate the same or similar components.

FIG. 1 depicts one embodiment of a liquid-cooled electronics rack 100 which employs a cooling system to be serviced utilizing the coolant servicing apparatus and methods described herein. In one embodiment, liquid-cooled electronics rack 100 comprises a plurality of electronics subsystems 110, which are processor or server nodes. A bulk power regulator 120 is shown disposed at an upper portion of liquid-cooled electronics rack 100, and two modular water cooling units (MWCUs) 130 are disposed in a lower portion of the liquid-cooled electronics rack. In the embodiments described herein, the coolant is assumed to be water or an aqueous-based solution, again, by way of example only.

In addition to MWCUs 130, the cooling system includes a system water supply manifold 131, a system water return manifold 132, and manifold-to-node fluid connect hoses 133 coupling system water supply manifold 131 to electronics subsystems 110, and node-to-manifold fluid connect hoses 134 coupling the individual electronics subsystems 110 to system water return manifold 132. Each MWCU 130 is in fluid communication with system water supply manifold 131 via a respective system water supply hose 135, and each MWCU 130 is in fluid communication with system water return manifold 132 via a respective system water return hose 136.

As illustrated, heat load of the electronics subsystems is transferred from the system water to cooler facility water supplied by facility water supply line 140 and facility water return line 141 disposed, in the illustrated embodiment, in the space between a raised floor 102 and a base floor 101.

Figure 2:
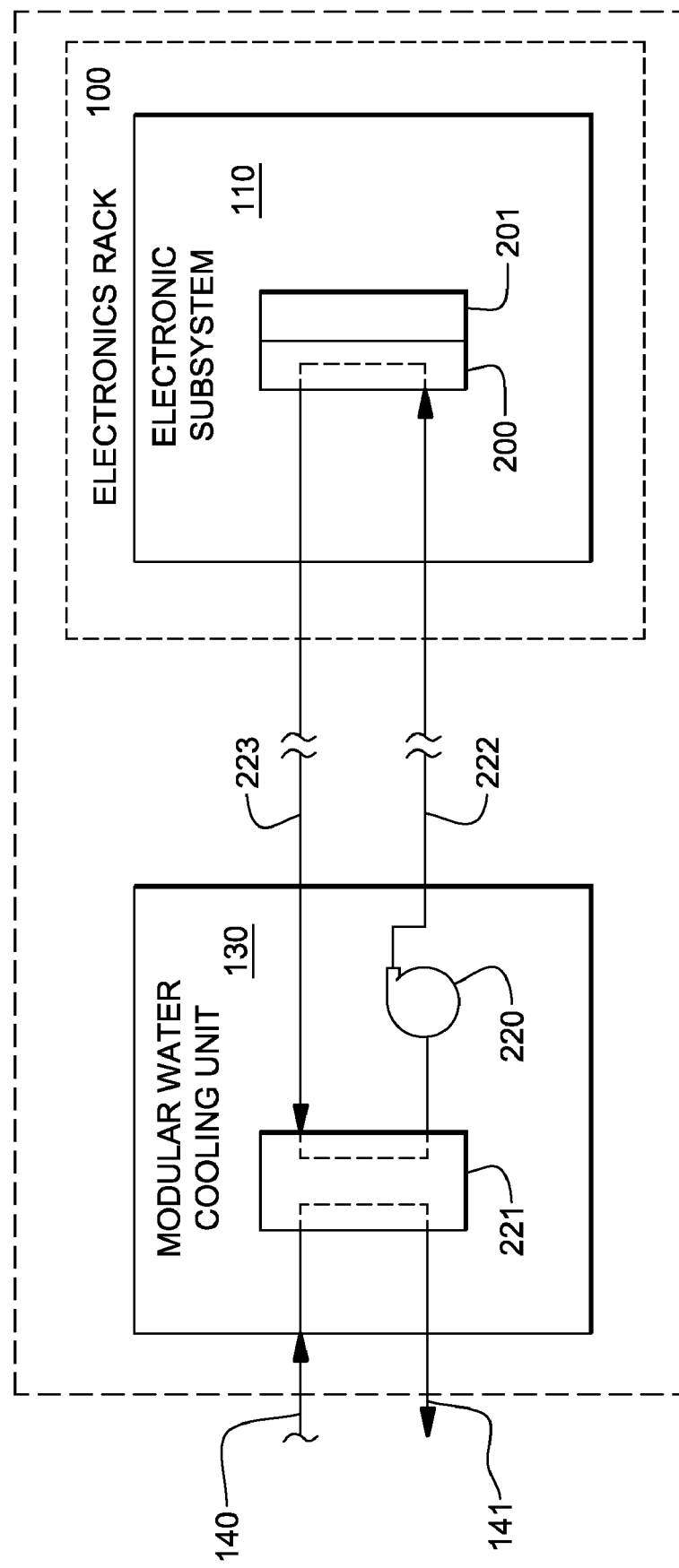
FIG. 2 is a schematic of one embodiment of an electronics subsystem of an electronics rack, wherein an electronics module is liquid-cooled by system coolant provided by one or more modular cooling units disposed within the electronics rack, in accordance with an aspect of the present invention.

FIG. 2 schematically illustrates operation of the cooling system of FIG. 1, wherein a liquid-cooled cold plate 200 is shown coupled to an electronics module 201 of an electronics subsystem 110 within the liquid-cooled electronics rack 100. Heat is removed from electronics module 201 via the system coolant circulated via pump 220 through cold plate 200 within the system coolant loop defined by liquid-to-liquid heat exchanger 221 of modular water cooling unit 130, lines 222, 223 and cold plate 200. The system coolant loop and modular water cooling unit are designed to provide coolant of a controlled temperature and pressure, as well as controlled chemistry and cleanliness to the electronics module(s). Furthermore, the system coolant is physically separate from the less controlled facility coolant in lines 140, 141, to which heat is ultimately transferred.

Figure 3:
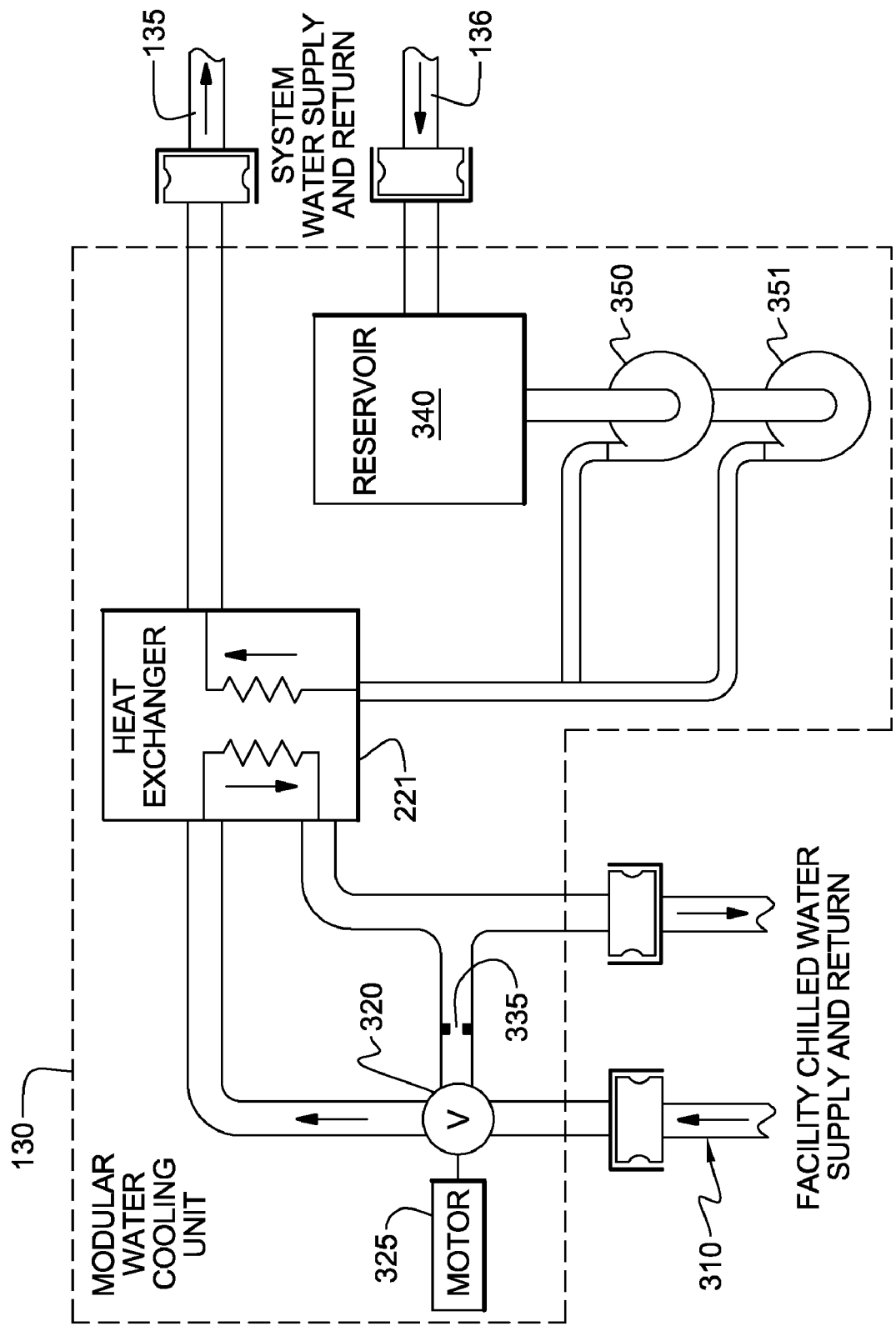
FIG. 3 is a schematic of one embodiment of a modular cooling unit disposed within a liquid-cooled electronics rack, in accordance with an aspect of the present invention.

FIG. 3 depicts a more detailed embodiment of a modular water cooling unit 130, in accordance with an aspect of the present invention. As shown in FIG. 3, modular water cooling unit 130 includes a first cooling loop wherein building chilled, facility coolant is supplied 310 and passes through a control valve 320 driven by a motor 325. Valve 320 determines an amount of facility coolant to be passed through heat exchanger 221, with a portion of the facility coolant possibly being returned directly via a bypass orifice 335. The modular water cooling unit further includes a second cooling loop with a reservoir tank 340 from which system coolant is pumped, either by pump 350 or pump 351, into the heat exchanger 221 for conditioning and output thereof, as cooled system coolant to the electronics rack to be cooled. The cooled system coolant is supplied to the system water supply manifold and system water return manifold of the liquid-cooled electronics rack via the system water supply hose 135 and system water return hose 136.

Figure 4:
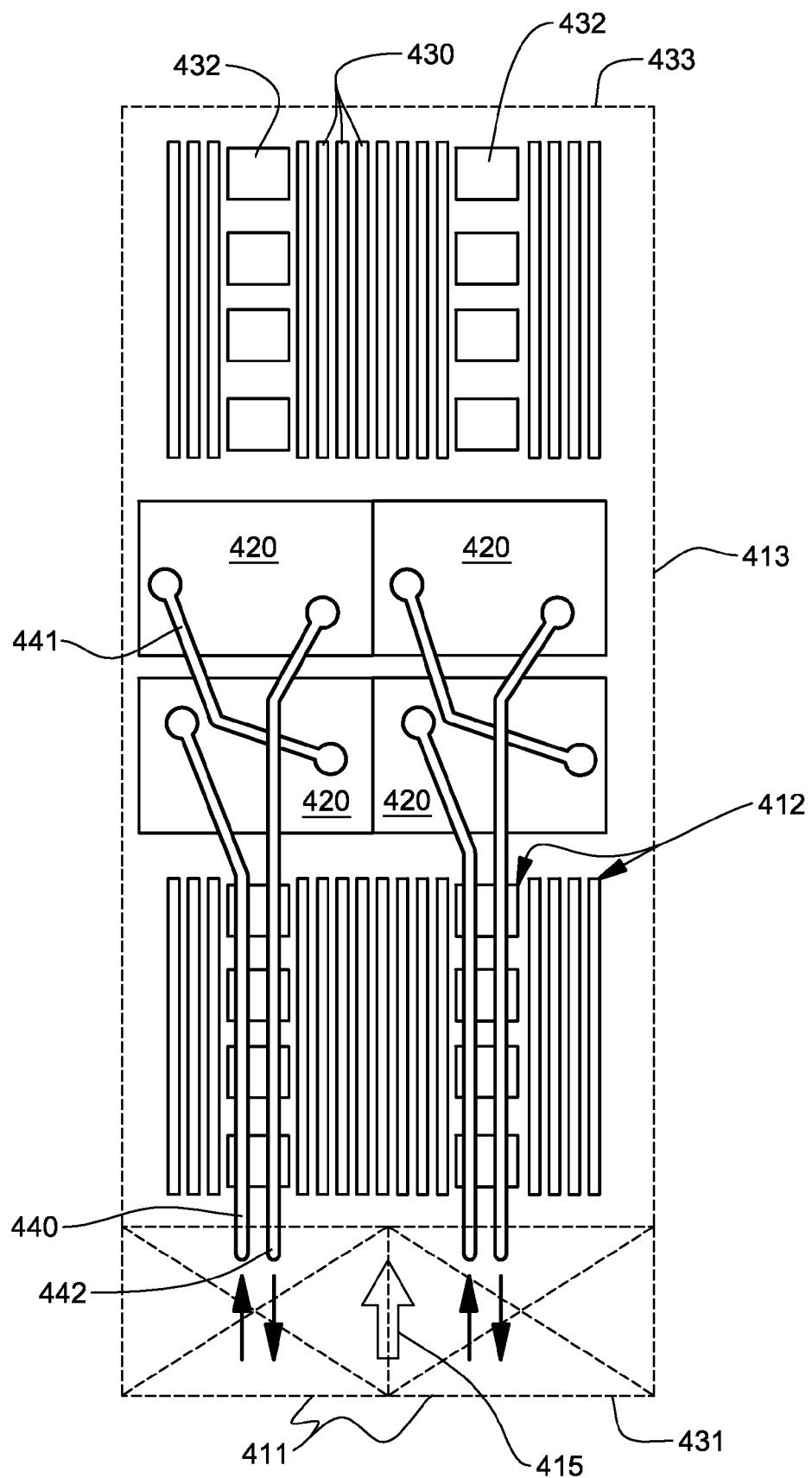
FIG. 4 is a plan view of one embodiment of an electronics subsystem layout illustrating an air and liquid cooling system for cooling components of the electronics subsystem, in accordance with an aspect of the present invention.

FIG. 4 depicts one embodiment of an electronics subsystem 413 component layout wherein one or more air moving devices 411 provide forced air flow 415 to cool multiple components 412 within electronics subsystem 413. Cool air is taken in through a front 431 and exhausted out a back 433 of the drawer. The multiple components to be cooled include multiple processor modules to which liquid-cooled cold plates 420 (of a liquid-based cooling system) are coupled, as well as multiple arrays of memory modules 430 (e.g., dual in-line memory modules (DIMMs)) and multiple rows of memory support modules 432 (e.g., DIMM control modules) to which air-cooled heat sinks are coupled. In the embodiment illustrated, memory modules 430 and the memory support modules 432 are partially arrayed near front 431 of electronics subsystem 413, and partially arrayed near back 433 of electronics subsystem 413. Also, in the embodiment of FIG. 4, memory modules 430 and the memory support modules 432 are cooled by air flow 415 across the electronics subsystem.

The illustrated liquid-based cooling system further includes multiple coolant-carrying tubes connected to and in fluid communication with liquid-cooled cold plates 420. The coolant-carrying tubes comprise sets of coolant-carrying tubes, with each set including (for example) a coolant supply tube 440, a bridge tube 441 and a coolant return tube 442. In this example, each set of tubes provides liquid coolant to a series-connected pair of cold plates 420 (coupled to a pair of processor modules). Coolant flows into a first cold plate of each pair via the coolant supply tube 440 and from the first cold plate to a second cold plate of the pair via bridge tube or line 441, which may or may not be thermally conductive. From the second cold plate of the pair, coolant is returned through the respective coolant return tube 442.

Figure 5:
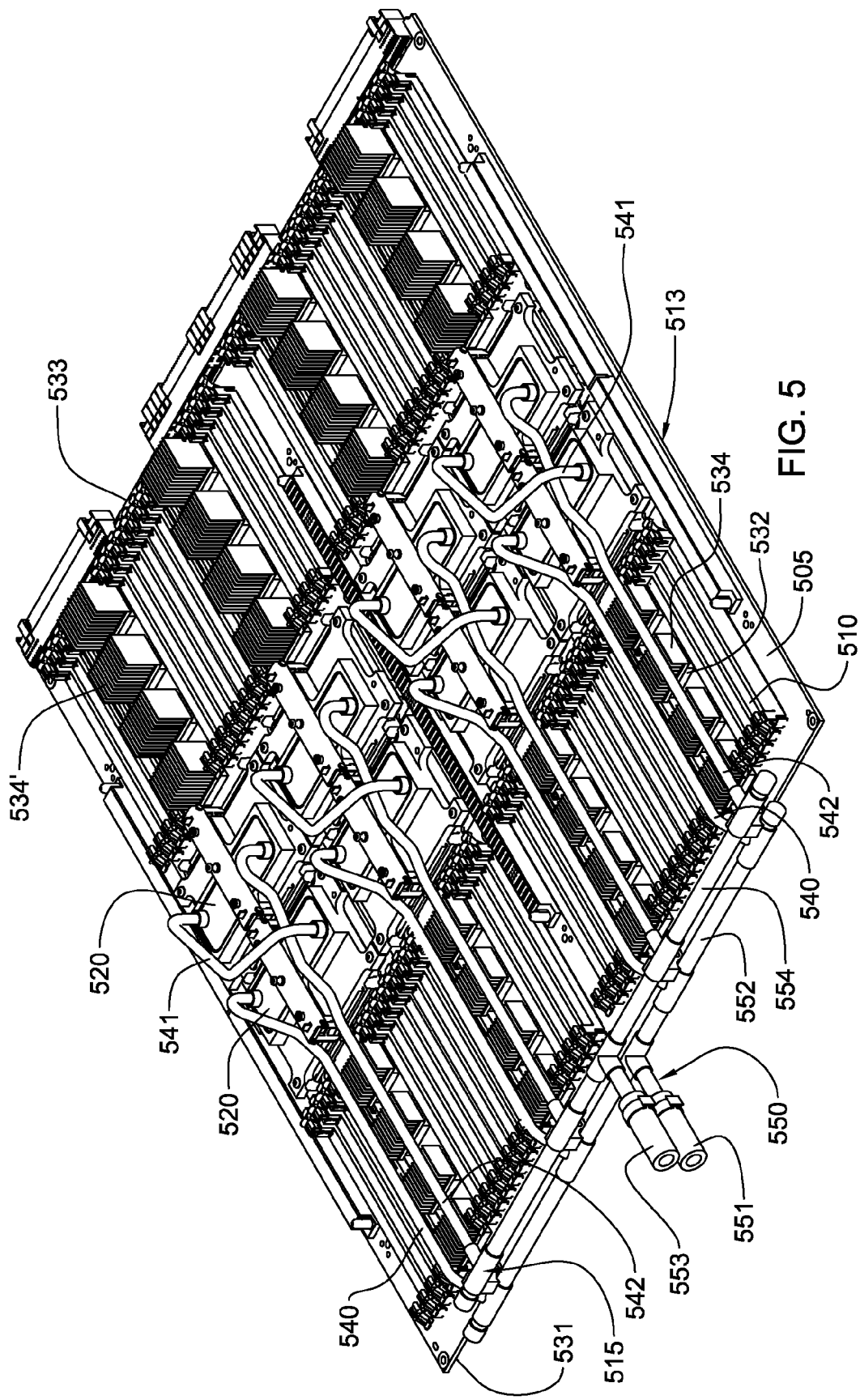
FIG. 5 depicts one detailed embodiment of a partially-assembled electronics subsystem layout, wherein the electronics subsystem includes eight heat-generating electronics components to be actively cooled, each having a respective liquid-cooled cold plate of a liquid-based cooling system coupled thereto, in accordance with an aspect of the present invention.

FIG. 5 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronics system, and thereby more effectively maintain the components at a desirable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronics system, and use flexible plastic or rubber tubing to connect headers, cold plates, pumps and other components. However, such a solution may not meet a given customer's specifications and need for reliability.

Thus, presented herein in one aspect is a robust and reliable liquid-based cooling system specially preconfigured and prefabricated as a monolithic structure for positioning within a particular electronics drawer.

FIG. 5 is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 5 depicts a partially assembled electronics system 513 and an assembled liquid-based cooling system 515 coupled to primary heat generating components (e.g., including processor dies) to be cooled. In this embodiment, the electronics system is configured for (or as) an electronics drawer of an electronics rack, and includes, by way of example, a support substrate or planar board 505, a plurality of memory module sockets 510 (with the memory modules (e.g., dual in-line memory modules) not shown), multiple rows of memory support modules 532 (each having coupled thereto an air-cooled heat sink 534), and multiple processor modules (not shown) disposed below the liquid-cooled cold plates 520 of the liquid-based cooling system 515.

In addition to liquid-cooled cold plates 520, liquid-based cooling system 515 includes multiple coolant-carrying tubes, including coolant supply tubes 540 and coolant return tubes 542 in fluid communication with respective liquid-cooled cold plates 520. The coolant-carrying tubes 540, 542 are also connected to a header (or manifold) subassembly 550 which facilitates distribution of liquid coolant to the coolant supply tubes and return of liquid coolant from the coolant return tubes 542. In this embodiment, the air-cooled heat sinks 534 coupled to memory support modules 532 closer to front 531 of electronics drawer 513 are shorter in height than the air-cooled heat sinks 534' coupled to memory support modules 532 near back 533 of electronics drawer 513. This size difference is to accommodate the coolant-carrying tubes 540, 542 since, in this embodiment, the header subassembly 550 is at the front 531 of the electronics drawer and the multiple liquid-cooled cold plates 520 are in the middle of the drawer.

Liquid-based cooling system 515 comprises a preconfigured monolithic structure which includes multiple (pre-assembled) liquid-cooled cold plates 520 configured and disposed in spaced relation to engage respective heat generating electronic components. Each liquid-cooled cold plate 520 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 520 to the associated electronic component to form the cold plate and electronic component assemblies. Alignment openings (i.e., thru-holes) are provided on the sides of the cold plate to receive alignment pins or positioning dowels during the assembly process, as described further in the above-incorporated patent application entitled "Method of Assembling a Cooling System for a Multi-Component Electronics System". Additionally, connectors (or guide pins) are included within attachment subassembly which facilitate use of the attachment assembly.

As shown in FIG. 5, header subassembly 550 includes two liquid manifolds, i.e., a coolant supply header 552 and a coolant return header 554, which in one embodiment, are coupled together via supporting brackets. In the monolithic cooling structure of FIG. 5, the coolant supply header 552 is metallurgically bonded in fluid communication to each coolant supply tube 540, while the coolant return header 554 is metallurgically bonded in fluid communication to each coolant return tube 552. A single coolant inlet 551 and a single coolant outlet 553 extend from the header subassembly for coupling to the electronics rack's coolant supply and return manifolds (not shown).

FIG. 5 also depicts one embodiment of the preconfigured, coolant-carrying tubes. In addition to coolant supply tubes 540 and coolant return tubes 542, bridge tubes or lines 541 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 540, bridge tubes 541 and coolant return tubes 542 are each preconfigured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are preconfigured for a particular electronics system to facilitate installation of the monolithic structure in engaging relation with the electronics system.

Figure 6:
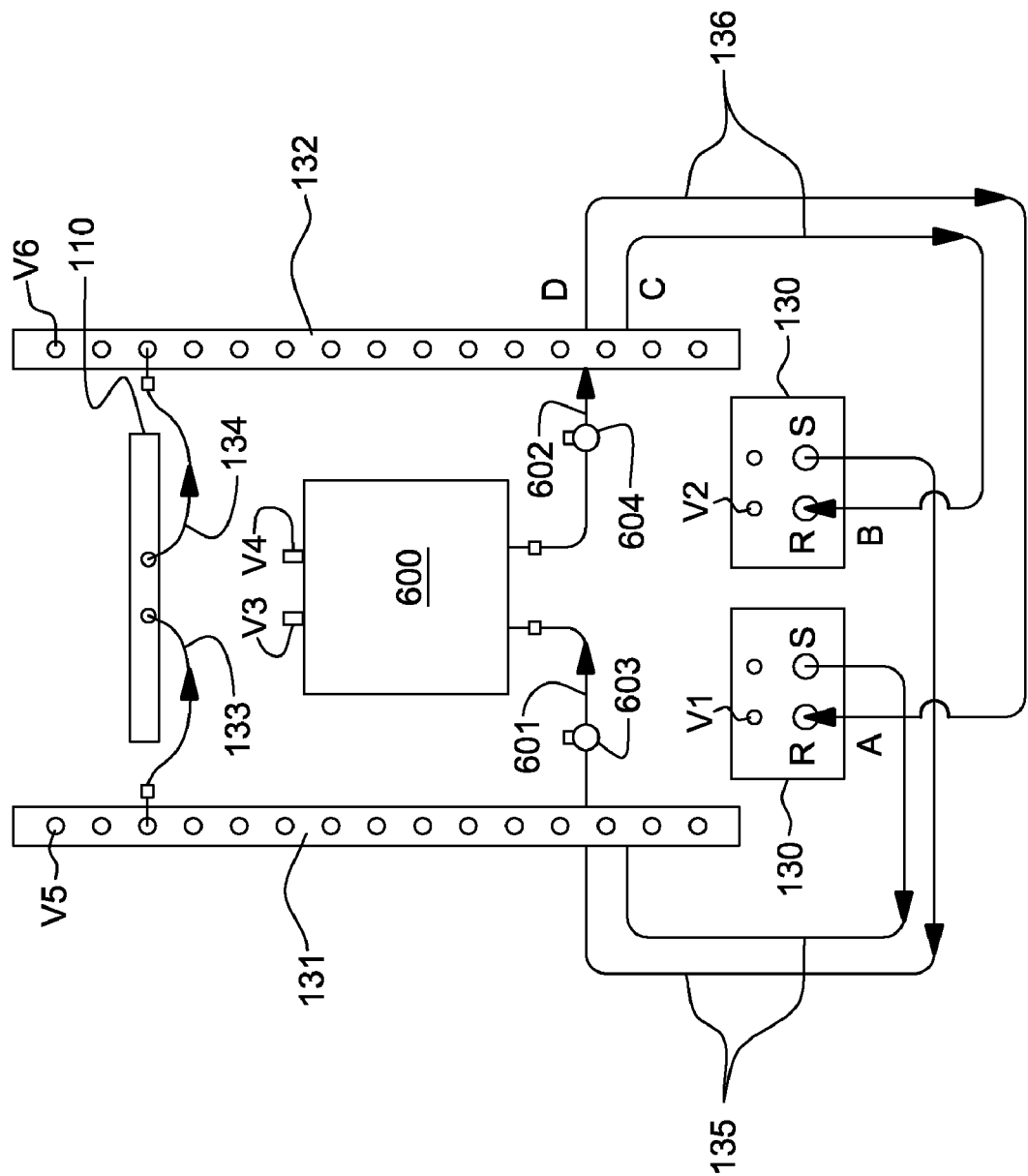
FIG. 6 is a schematic of one embodiment of a cooling system employed within a liquid-cooled electronics rack, the cooling system including supply and return manifolds for providing liquid coolant to electronics subsystems to be cooled, and for providing liquid coolant to an air-to-liquid heat exchanger disposed at an air outlet side of the electronics rack for cooling air egressing therefrom, in accordance with an aspect of the present invention.

FIG. 6 is a simplified schematic of the cooling system of FIG. 1, in combination with a rear door air-to-liquid heat exchanger 600 (not shown to scale), for cooling air egressing from the air outlet side of the electronics rack. Each electronics subsystem or node 110 is coupled in fluid communication between system water supply manifold 131 and system water return manifold 132 via a pair of respective manifold-to-node connect hoses 133, 134. Similarly, in this embodiment, air-to-liquid heat exchanger 600 is coupled in fluid communication between system water supply manifold 131 and system water return manifold 132 via manifold-to-heat exchanger hoses 601, 602, each of which includes a flow control valve 603, 604, such as a solenoid-operated shut-off valve. Modular water cooling units 130 supply system water via system water supply hoses 135 and receive exhausted water via system water return hoses 136. As shown in FIG. 6, the cooling system includes a plurality of air-vent ports V1, V2, V3, V4, V5 & V6. Due to the complex configuration of the cooling system, these air vent ports facilitate filling of coolant into the cooling system by allowing for bleeding of air from the system during the filling process, as explained further below.

As noted above, each modular water cooling unit (MWCU) 130 is sized to fit within the electronics rack, and therefore, the water reservoir/expansion tank thereof is necessarily relatively small in size and is unable to contain enough liquid coolant to fill all the hoses and cold plates in the illustrated cooling system. Also, due to the MWCU location (e.g., at the bottom of the electronics rack) and relatively small volume of the water reservoir thereof, it is difficult to fill the hoses and cold plates by simply adding coolant (such as water) through an opening at the top of the modular water cooling unit. Thus, a specially-designed coolant servicing apparatus is described herein to provide a mechanism and protocol for facilitating filling and draining coolant from the cooling system of a liquid-cooled electronics rack.

Figure 7:
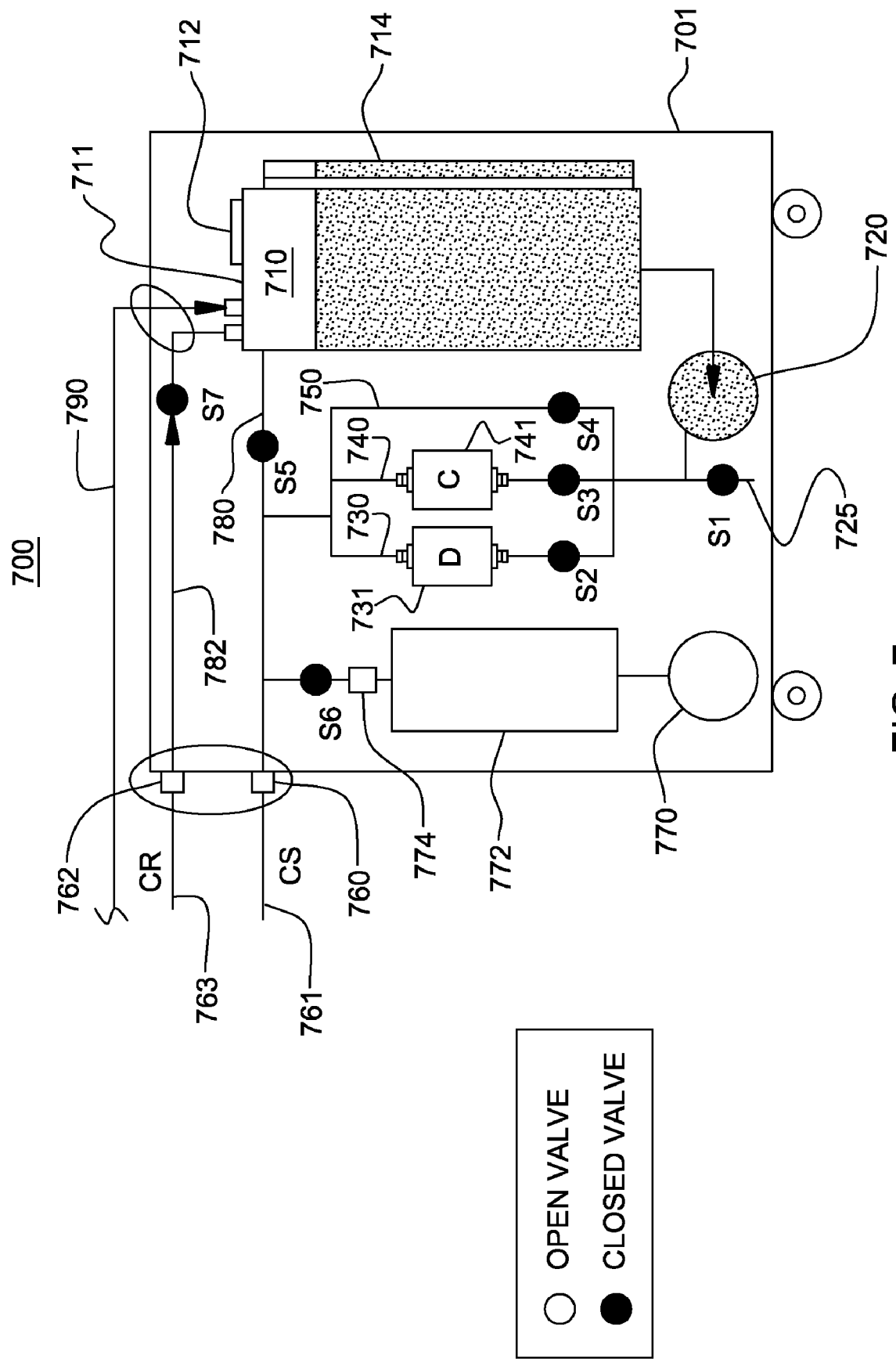
FIG. 7 is a schematic of one embodiment of a coolant servicing apparatus, in accordance with an aspect of the present invention.

FIG. 7 depicts one embodiment of a coolant servicing apparatus, generally denoted 700, in accordance with an aspect of the present invention. Coolant servicing apparatus 700 includes a coolant tank 710 and a coolant pump 720 in fluid communication with the coolant tank for pumping coolant therefrom. Coupled to an output of coolant pump 720 are a drain line 725 and multiple parallel-connected coolant supply lines 730, 740 & 750 for coupling the coolant pump to a coolant supply port 760 of coolant servicing apparatus 700. Drain line 725 includes a coolant control valve S1, which in one embodiment, is a solenoid-operated flow control valve.

Each coolant supply line 730, 740 & 750 of the multiple parallel-connected coolant supply lines also includes a solenoid-operated coolant control valve S2, S3 & S4, respectively, for selectively controlling flow of coolant therethrough pumped by coolant pump 720 from coolant tank 710 to coolant supply port 760. In the embodiment illustrated, coolant supply line 730 further includes a deionization filter 731, and coolant supply line 740 includes a particulate filter 741, such as a charcoal filter. Coolant supply line 750 is a bypass coolant supply line with no filter.

The coolant servicing apparatus 700 further includes a coolant return port 762. In one embodiment, coolant supply port 760 and coolant return port 762 are quick connect couplings, which respectively receive a supply line 761 and a return line 763 for coupling the apparatus to the liquid-cooled electronics rack (not shown). The quick connect couplings may be any one of various types of commercially available couplings, such as those available from Colder Products Company, of St. Paul, Minn., USA, or Parker Hannifin, of Cleveland, Ohio, USA. By way of example, the system supply line 761 and system return line 763 may each comprise a Parker Hannifin ¾ F QC (2×) for coupling the coolant supply port to two ports of the cooling system and the coolant return port to two ports of the cooling system, as explained below.

As illustrated, a first port line 780 couples coolant supply port 760 and one end of the multiple parallel-connected coolant supply lines to an upper portion of coolant tank 710 above a coolant full level. Similarly, a second port line 782 couples coolant return port 762 in fluid communication with an upper portion of coolant tank 710 above a coolant full level thereof. The first port line 780 includes a solenoid-operated coolant control valve S5, while the second port line 782 includes a solenoid-operated coolant control valve S7 for controlling flow of coolant or air therethrough, in accordance with the protocols described below.

The coolant servicing apparatus further includes a pressurized air source, which in the embodiment illustrated, comprises an air compressor 770, an air holding tank 772, an air regulator 774 and an air flow control valve S6 coupled in-series for provision of pressurized air flow to the coolant supply port 760 of the apparatus for facilitating draining of coolant from the cooling system of the liquid-cooled electronics rack, and for facilitating draining of the coolant servicing apparatus 700 itself. In alternate embodiments, other pressurized air sources may be employed. For example, the pressurized air source may be facility compressed air, or alternatively, a bottle of compressed gas, such as nitrogen.

If desired, a controller (not shown) can be provided for automated control of the solenoid-operated control valves to implement the protocols described hereinbelow. Prior to automated operation, a service technician manually makes supply line and return line connections to the cooling system of the liquid-cooled electronics rack and then, for example, pushes a button or otherwise initiate operation of the coolant servicing apparatus employing a controller programmed with the logic flows described hereinbelow. Alternatively, it is possible to have a fully manual implementation of the coolant servicing protocols described below.

As shown in FIG. 7, coolant supply port 760 and coolant return port 762 are disposed within apparatus 700 at a level above a coolant full level of coolant tank 710 (e.g., at the coolant level illustrated in FIG. 7). An air-vent line 790 is, in one embodiment, a fixed connection to an upper portion 711 of coolant tank 710. This air-vent line 790 comprises a flexible tube of sufficient length to couple to one or more air-vent ports in the cooling system to be serviced. In the embodiment of FIG. 6, six air-vent ports (V1-V6) are illustrated, by way of example, and air-vent line 790 is of sufficient length to couple to these air-vent ports. In the protocol described hereinbelow, air-vent line 790 is sequentially connected to each air-vent port of the cooling system for bleeding air from different regions of the cooling system. In an alternate implementation, the air-vent line could be configured to couple in parallel to multiple air-vent ports of the cooling system for simultaneously bleeding air from different regions of the system.

Continuing with FIG. 7, coolant tank 710 includes an access cover 712 and a coolant level indicator 714. A housing 701 provides a framework for supporting the illustrated components of the coolant servicing apparatus 700, and in particular, for maintaining coolant supply port 760 and coolant return port 762 in fixed position within the apparatus at a level above the coolant full level of the coolant tank.

Figure 8A:
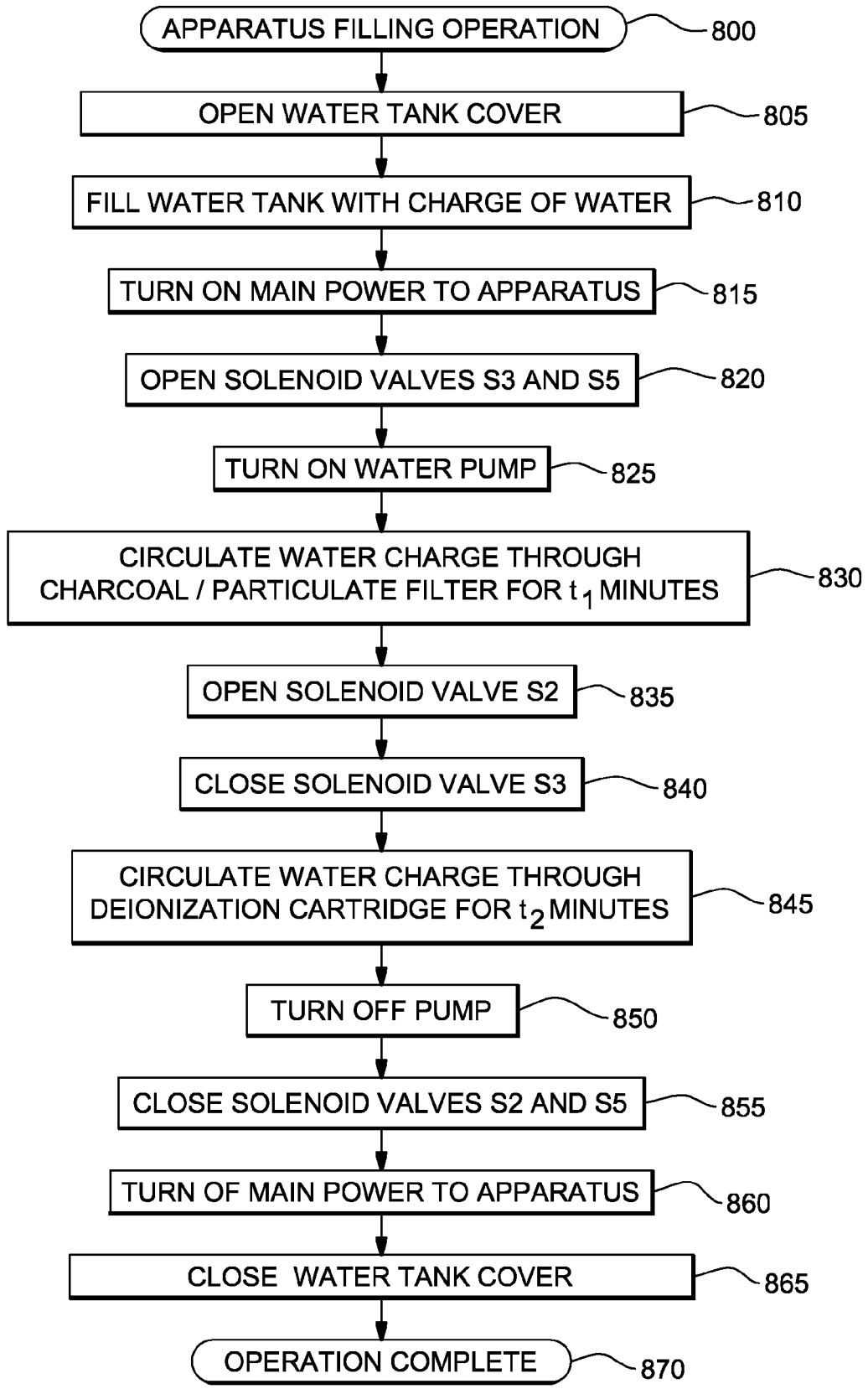
FIG. 8A is a flowchart of one embodiment of a protocol for filling the coolant servicing apparatus of FIGS. 7 & 8, in accordance with an aspect of the present invention.

FIGS. 8 & 8A illustrate one embodiment of protocol for filling the coolant servicing apparatus 700, in accordance with an aspect of the present invention. Referring to both figures together, the apparatus filling operation 800 begins with opening 805 the water tank's 710 access cover 712. Water tank 710 is filled with a charge of water 810 and main power to the apparatus is turned ON 815. The coolant tank is sized to hold an amount of water at least equal to the volume of the water required to fill the cooling system to be charged. As one example, the coolant tank may have a 10 gallon capacity, and the cooling system, when full, may require 7 gallons of water. Solenoid-operated coolant control valves S3 & S5 are opened 820, the water pump is turned ON 825 and water within the coolant tank is circulated through the particulate filter 741 within the coolant supply line 740 for at least a first period of time ($t_1$ minutes) 830. In one example, period of time $t_1$ is a sufficient amount of time to allow the water charge in the coolant tank to pass through the particulate filter multiple times, for example, at least three times. The value of time $t_1$ may be determined by dividing the volume of the coolant tank by the flow rate of the coolant pump used in the apparatus and multiplying by the number of times the coolant is to pass through the filter. After circulating the water through the particulate filter, the coolant control valve S2 is opened 835, and coolant control valve S3 is closed 840. This forces coolant through coolant supply line 730, and in particular, through deionization filter 731. Water continues to circulate through deionization filter 731 for at least a second period of time (i.e., $t_2$ minutes) 845. The coolant pump is then turned OFF 850, and coolant control valves S2 & S5 are closed 855. Main power to the coolant servicing apparatus is also turned OFF 860 and the access cover 712 to the coolant tank is closed 865, which completes filling of the coolant servicing apparatus 870.

Figure 9:
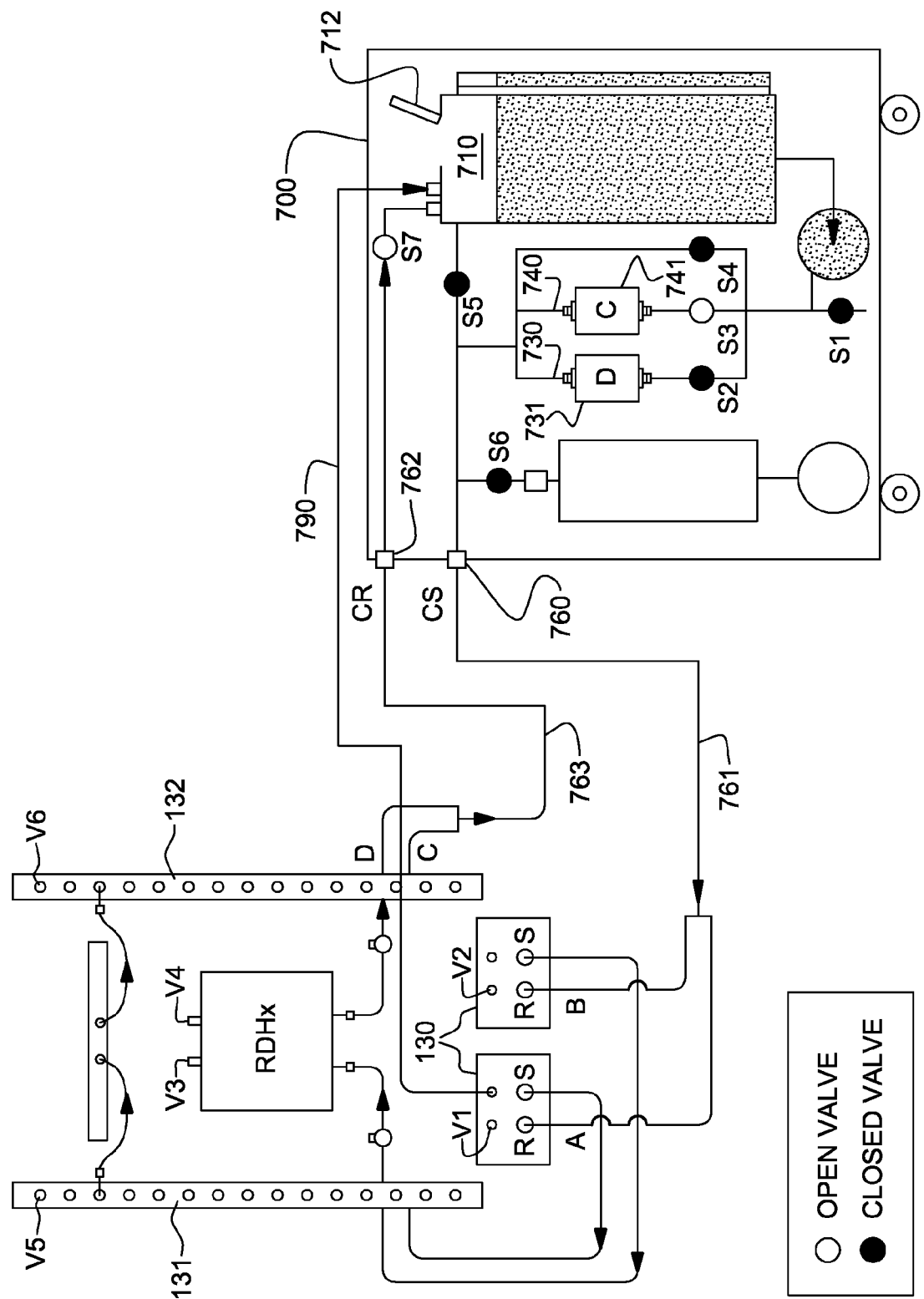
FIG. 9 illustrates filling of the cooling system of FIG. 6, employing the coolant servicing apparatus of FIG. 7, in accordance with an aspect of the present invention.
Figure 9B:
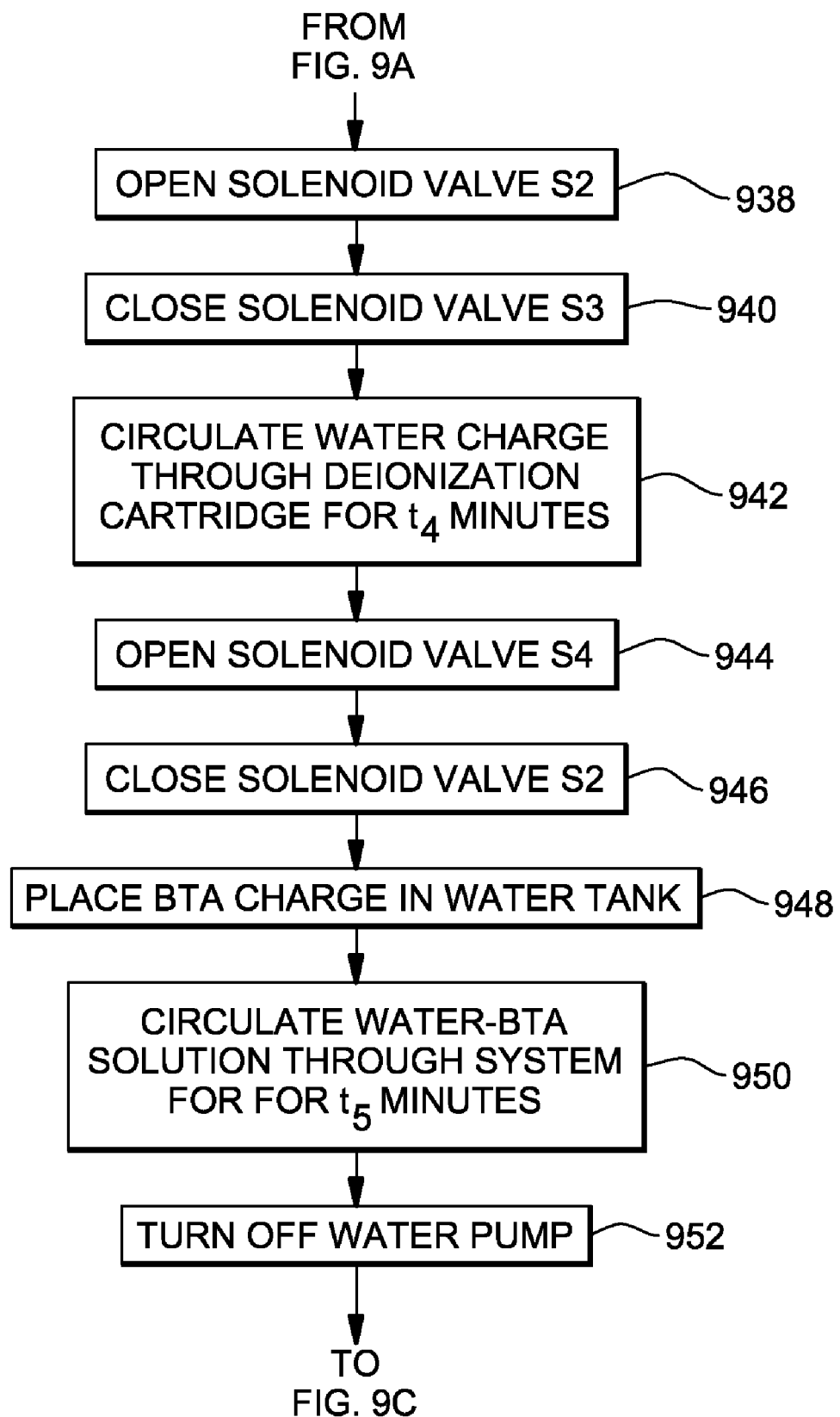
Figure 9C:
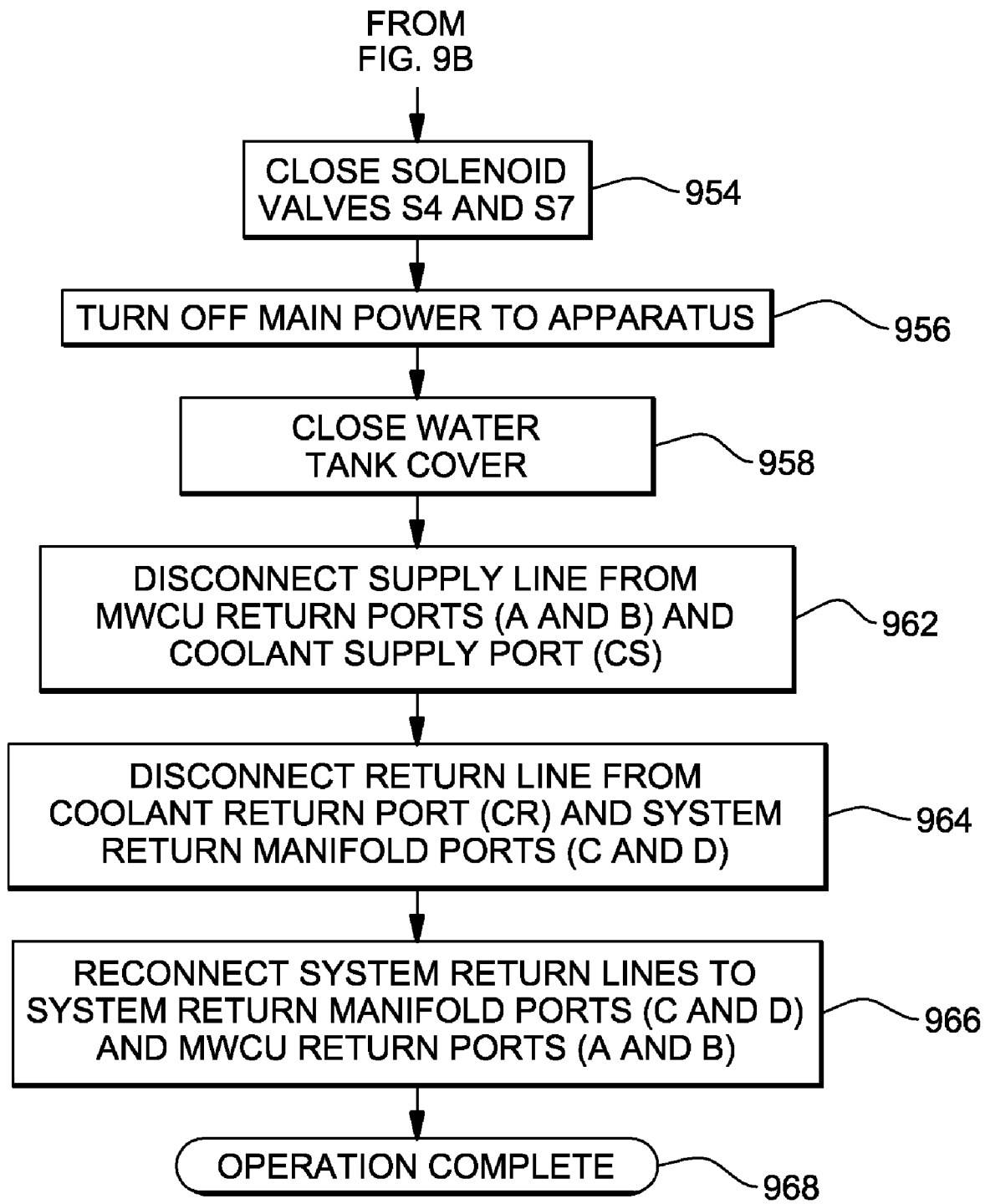

FIGS. 9, 9A, 9B & 9C illustrate one embodiment of protocol for filling the cooling system of FIG. 6 employing the coolant servicing apparatus of FIG. 7. Again referring to these figures collectively, the cooling system filling 900 begins with disconnecting the system water return hoses from manifold ports C & D and MWCU return ports A & B 901. Supply line 761 is connected to the coolant supply port 760 and to the MWCU return ports A & B 902. Return line 763 is connected to the coolant return port 762 and to the system return manifold ports C & D 904, as illustrated in FIG. 9. The water tank's 710 access cover 712 is opened 906 and main power to the coolant servicing apparatus is turned ON 908. Solenoid-operated coolant control valves S3 & S7 are opened 910 and the water pump is turned ON 912 to effectuate water flow through the particulate filter 741 of coolant supply line 740 before being output through supply line 761 to MWCUs 130 of the cooling system. Further action is delayed time $t_3$ minutes 914 to allow the water to distribute throughout the cooling system and return through coolant control valve S7 into the coolant tank, albeit with air bubbles in the flow stream returning to the tank. Similar to time $t_1$, the value of time $t_3$ may be determined by dividing the internal volume of the cooling system (i.e., the volume of water required to fill the cooling system) by the flow rate of the coolant pump used in the apparatus.

A variable i is initially set equal to '1' 916 in order to select air-vent port V1 within the cooling system. Air-vent line 790 is then connected to air-vent port V1 918 and coolant control valve S7 is closed 920. Processing waits a period of time 922 (for example, 15 seconds), and an operator visually checks the air-vent line 790 at the water tank return inlet for the presence of air 924. If air bubbles are present in the air-vent line at the water tank return 926, then solenoid-operated coolant control valve S7 is opened 928 to again allow circulation of coolant therethrough to the coolant tank. After waiting a period of time 930 (e.g., 15 seconds), solenoid valve S7 is closed 920, and after waiting further 922 (for example, 15 seconds), an operator visually checks the air-vent line at the water tank return 924. Once no air bubbles are detected, solenoid-operated coolant control valve S7 is opened 932 and processing determines whether all vent ports have been bled 935. If "no", then variable i is incremented to the next air-vent port 936.

Once all air-vent ports have been bled of air, solenoid valve S2 is opened 938, solenoid valve S3 is closed 940 and the water charged is circulated through deionization cartridge 731 for a period of $t_4$ minutes 942. After the circulating coolant has passed through the deionization cartridge for the selected time interval, for example, sufficient for the coolant to complete one or more loops through the cooling system and coolant servicing apparatus, coolant control valve S4 is opened 944, and coolant control valve S2 is closed 946. An operator then places a BTA corrosion inhibitor charge within the water tank via the access cover 948, and the water-BTA solution is circulated through the cooling system and the coolant servicing apparatus for $t_5$ minutes 950, after which the coolant pump is turned OFF 952.

Next, the coolant control valves S4 & S7 are closed 954 and main power to the coolant servicing apparatus is turned OFF 956, after which the water tank access cover is closed 958. The coolant servicing apparatus is then disconnected from the cooling system by disconnecting the supply line from the MWCU return ports A & B and from the coolant supply port 962, and by disconnecting the return line from the coolant return port and from system return manifold ports C & D 964, after which the cooling system is reconnected by connecting the system water return lines C & D to the coolant return ports of the MWCUs return ports A & B 966, which completes one embodiment of the cooling system filling operation 968.

Figure 10:
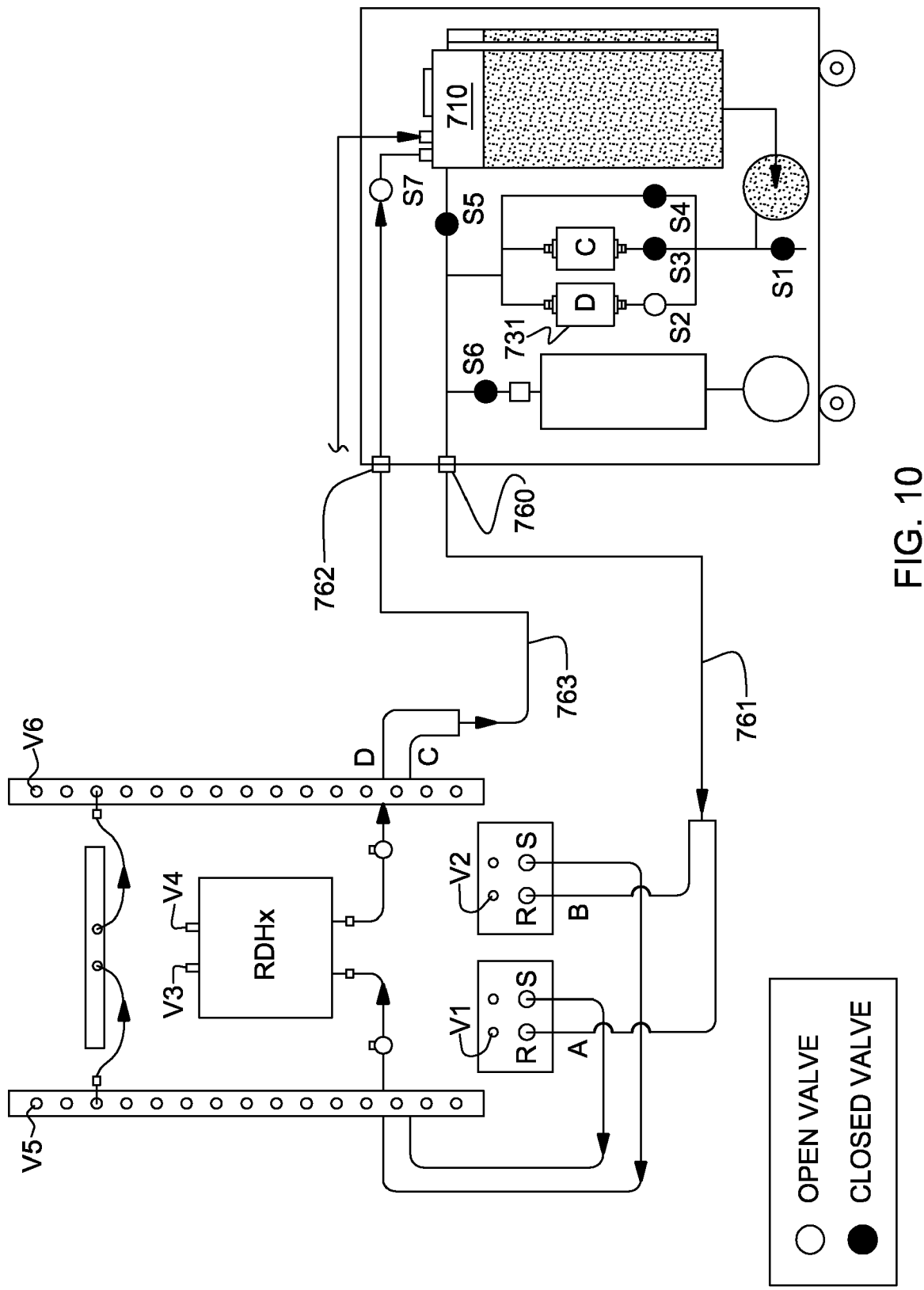
FIG. 10 illustrates the cooling system of FIG. 6 and coolant servicing apparatus of FIG. 7 connected thereto for deionizing coolant within the cooling system, in accordance with an aspect of the present invention.
Figure 10A:
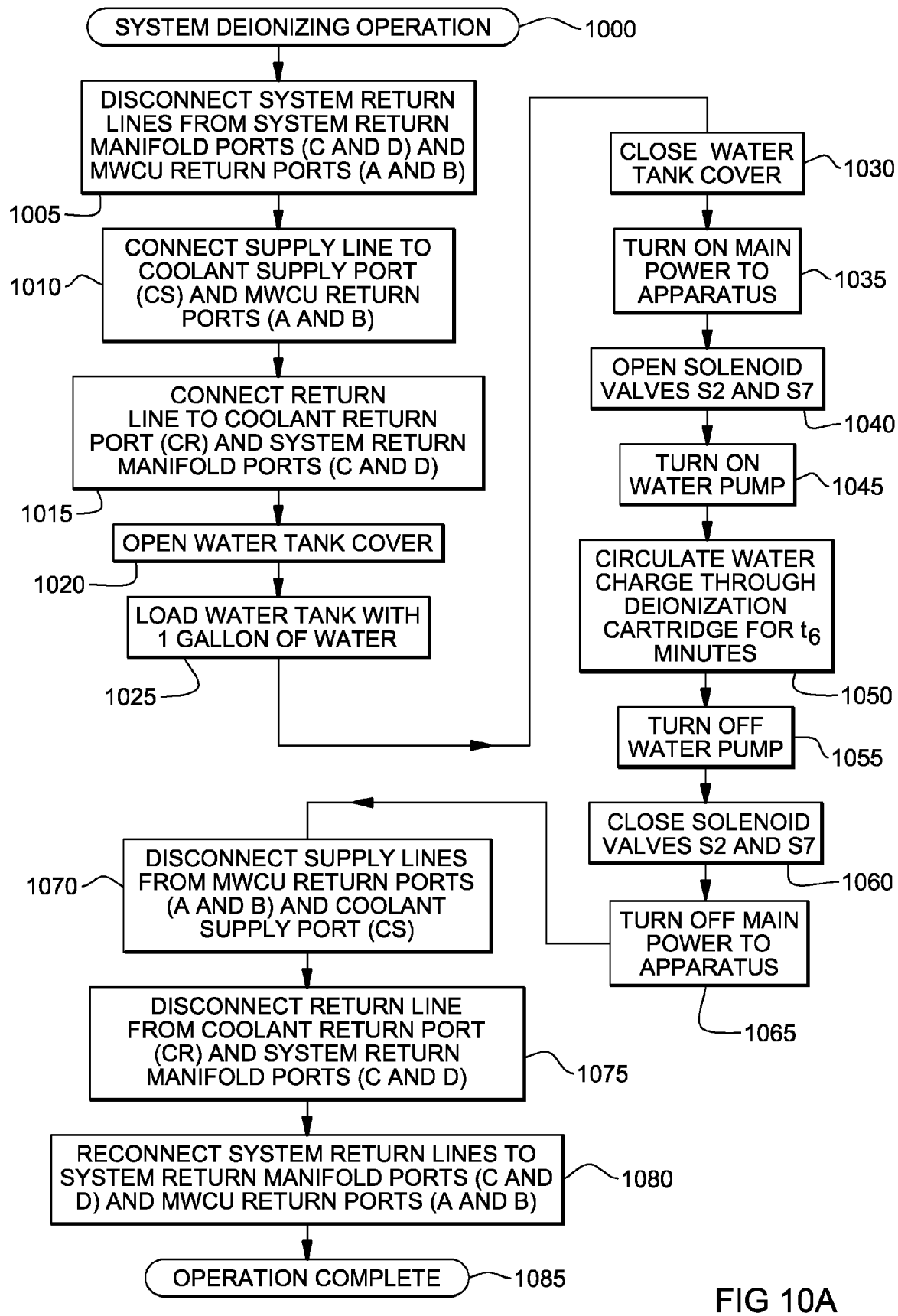
FIG. 10A is a flowchart of one embodiment of a protocol for deionizing coolant within the cooling system of FIG. 6 employing the coolant servicing apparatus of FIG. 7, in accordance with an aspect of the present invention.

FIGS. 10 & 10A depict one embodiment of protocol for deionizing coolant resident within a cooling system employing the coolant servicing apparatus disclosed herein. Referring to both figures together, system deionizing 1000 begins by disconnecting 1005 system water return lines from the system return manifold ports C & D, and from the MWCU return ports A & B. Supply line 761 is then connected to coolant supply port 760 and the MWCU return ports A & B 1010, while return line 763 is connected to coolant return port 762 and the system water return manifold ports C & D 1015. The access cover to the water tank is opened 1020 and the water tank is loaded with an amount of water, for example, one gallon of water 1025, after which the water tank access cover is closed 1030 and main power to the coolant servicing apparatus is turned ON 1035. Solenoid-operated coolant control valve S2 in coolant supply line 730 and solenoid-operated coolant control valve S7 in fluid communication with coolant return port 762 are opened 1040 and the water pump is turned ON 1045. The water charge is circulated through the deionization cartridge 731 for a period of time of $t_6$ minutes 1050. In one example, time $t_6$ minutes may be sufficient for the coolant within the cooling system and coolant servicing apparatus to circulate through the deionization filter two or three times.

After circulating the water charge through the deionization filter, the water pump is turned OFF 1055 and solenoid valves S2 & S7 are closed 1060. Main power to the apparatus is turned OFF 1065 and supply line 761 from MWCU return ports A & B to coolant supply port 760 is disconnected 1070, as well as return line 763 from coolant return port 762 to the system water return manifold ports C & D 1075. The system water return lines are then reconnected to the system return manifold ports C & D and to the MWCU return ports A & B 1080, which completes the deionization operation 1085. By way of example, the deionization operation may be employed once a year to condition or recondition the system water within the cooling system. After deionization, a BTA-charge may be injected into the coolant tank for mixing and circulation with the deionized water. In such a case, valve S2 is closed and valve S4 is opened to allow the solution to circulate directly through to the cooling system and back to the coolant servicing apparatus.

Figure 11:
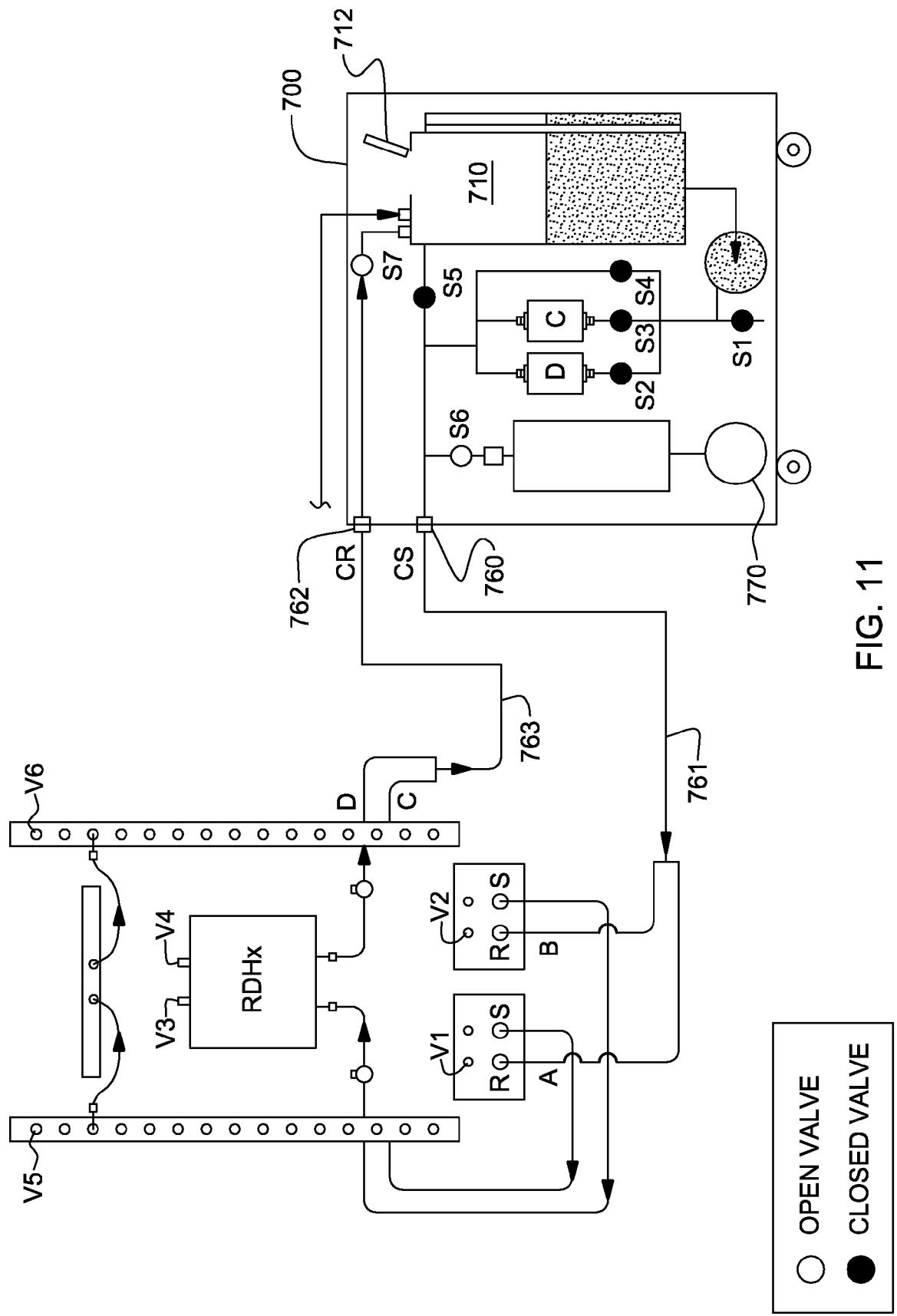
FIG. 11 is a schematic illustration of the cooling system of FIG. 6 and coolant servicing apparatus of FIG. 7 connected thereto for draining coolant from the cooling system, in accordance with an aspect of the present invention.
Figure 11A:
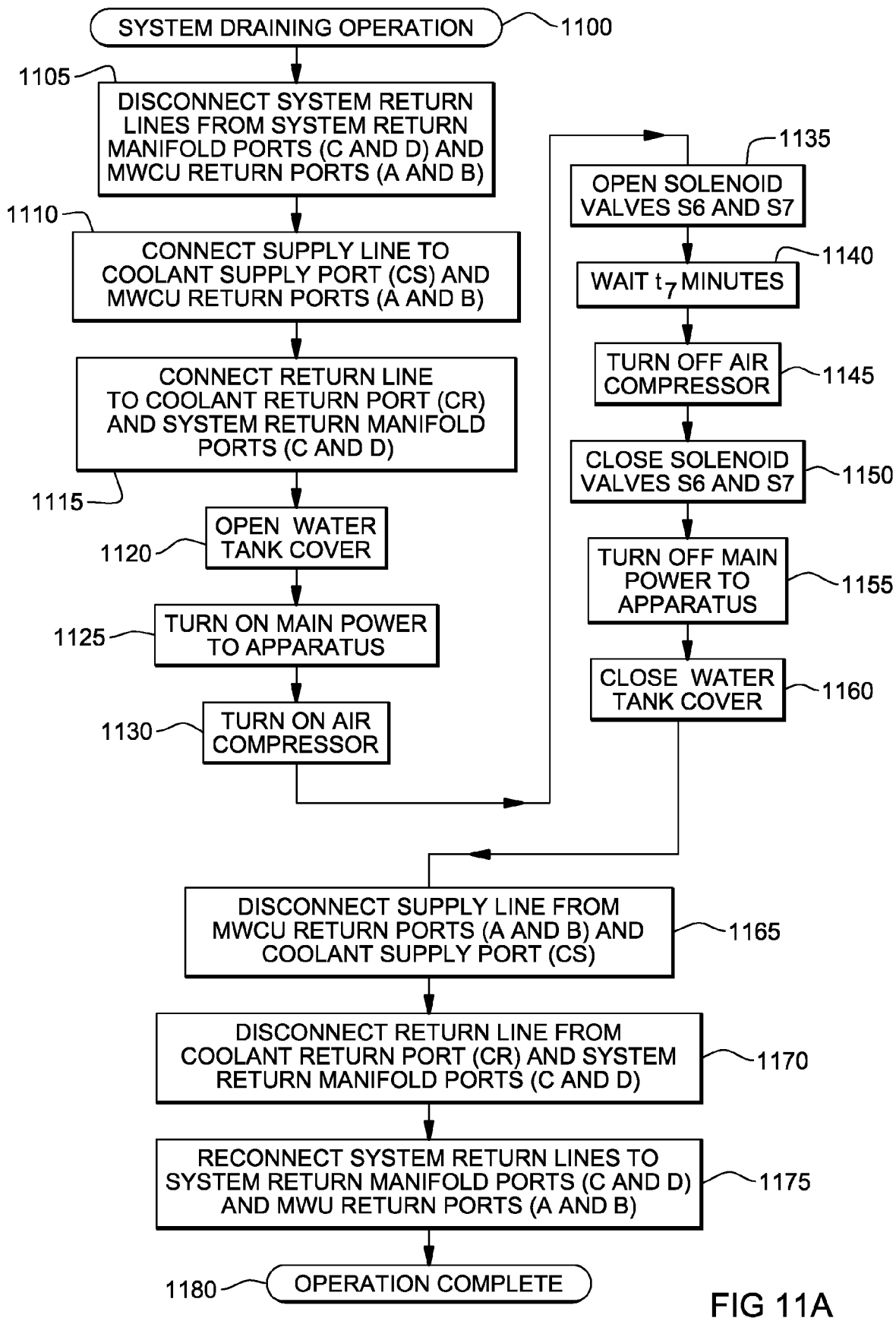
FIG. 11A is a flowchart of one embodiment of a protocol for draining coolant from the cooling system of FIG. 6 employing the coolant servicing apparatus of FIG. 7, in accordance with an aspect of the present invention.

FIGS. 11 & 11A illustrate one embodiment of protocol for draining system coolant from the cooling system employing the coolant servicing apparatus of FIG. 7. Referring to FIGS. 11 & 11A together, system coolant draining begins 1100 by disconnecting the system water return lines from the system return manifold ports C & D and the MWCU return ports A & B 1105. Supply line 761 is then connected to the coolant supply port 760 and the MWCU return ports A & B 1110, and return line 763 is connected to the coolant return port 762 and the system water return manifold ports C & D 1115, the water tank access cover 712 is opened 1120, main power is turned ON 1125 to the coolant servicing apparatus, and the air compressor 770 is turned ON 1130. Control valves S6 & S7 are opened 1135 allowing compressed air to push through the cooling system and back to the coolant tank 1135. This operation continues for a period of time $t_7$ 1140, after which the air compressor is turned OFF 1145 and control valves S6 & S7 are closed 1150. The main power to the coolant servicing apparatus is then turned OFF 1155 and the water tank access cover is closed 1160.

The predefined time interval $t_3$ is selected so that a majority of the coolant is drained from the cooling system upon expiration of the time interval. The amount of time required to drain a particular cooling system can be readily determined by experimentation. Draining the cooling system is intended to prepare the electronics rack for shipment under conditions which freezing of water could occur. Thus, a sufficient amount of water needs to be removed from the cooling system in the critical areas of the system to preclude the possibility of damage due to freezing. The specific time required to achieve this goal depends upon the volume of the cooling system, the volume of the air holding tank in the apparatus, and the air regulator discharge pressure. After waiting time interval $t_3$, supply line 761 is disconnected 1165 from MWCU return ports A & B and from the coolant supply port, and return line 763 is disconnected from the coolant return port and the system water return manifold ports C & D 1170. The system water return lines are subsequently reconnected to the system return manifold ports C & D and the MWCU return ports A & B 1175, which completes the cooling system draining operation 1180.

Figure 12:
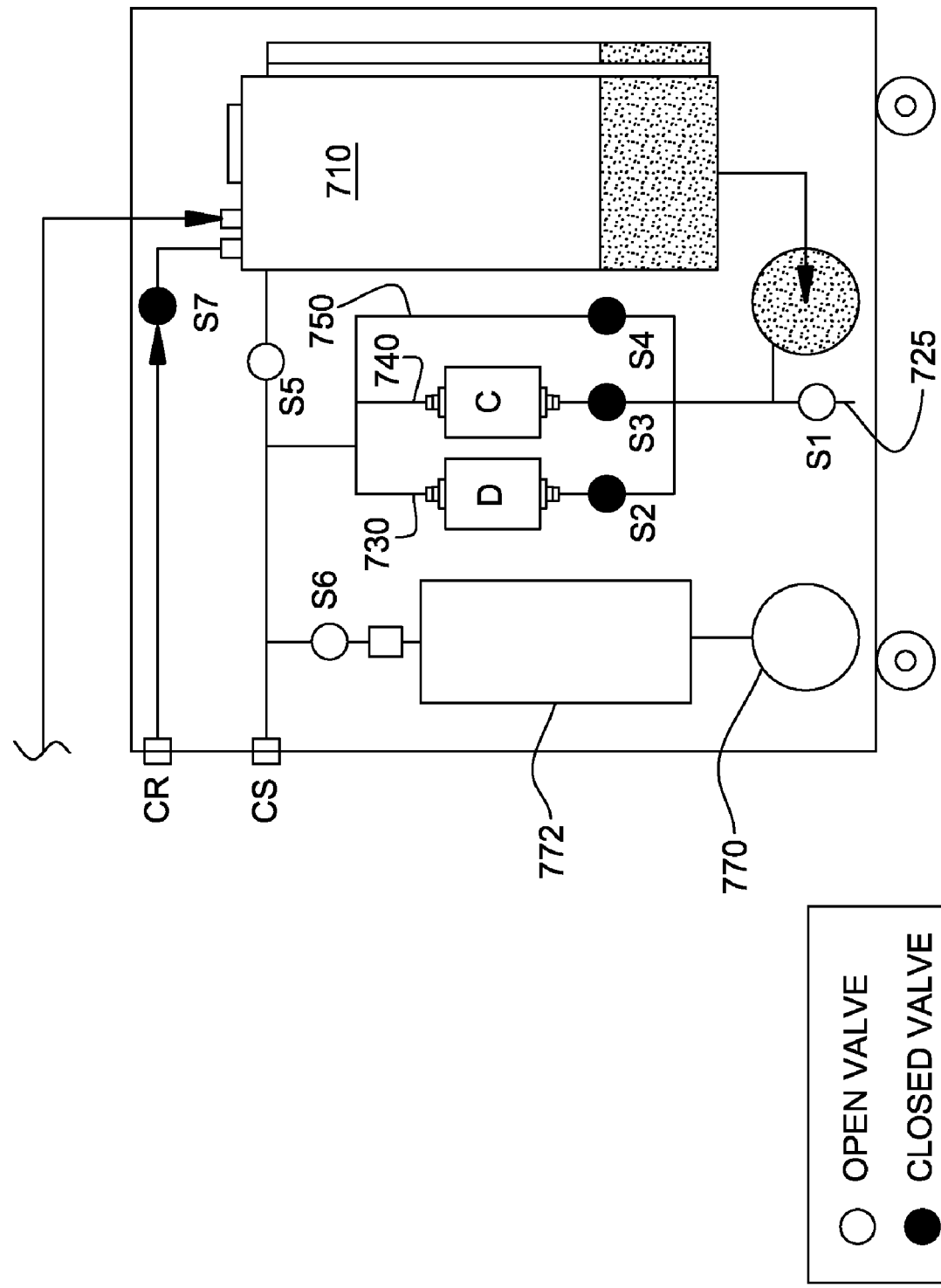
FIG. 12 illustrates the coolant servicing apparatus of FIG. 7, configured for draining coolant from the coolant servicing apparatus, in accordance with an aspect of the present invention.
Figure 12A:
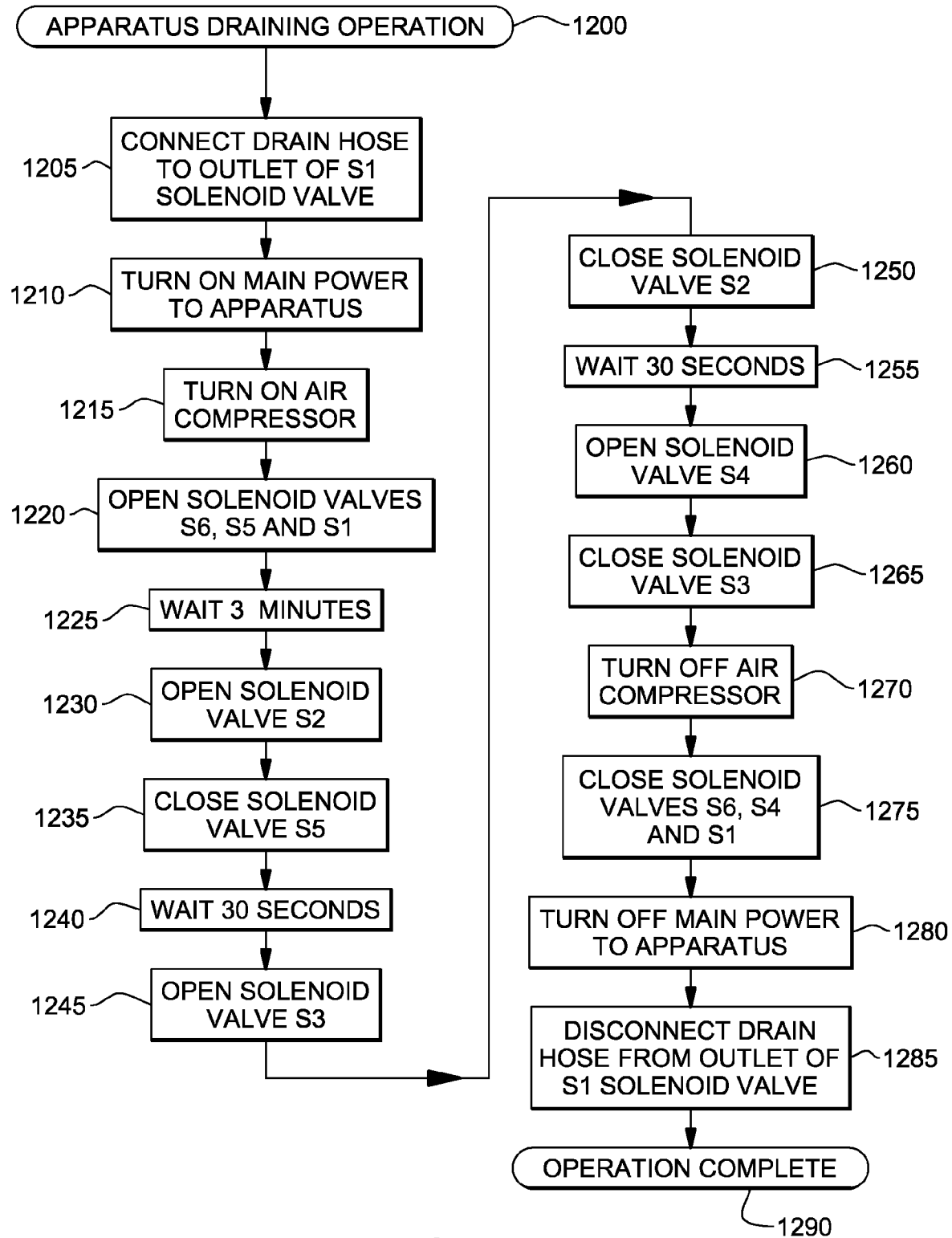
FIG. 12A is a flowchart of one embodiment of a protocol for draining coolant from the coolant servicing apparatus, in accordance with an aspect of the present invention.

FIGS. 12 & 12A depict one embodiment of a protocol for draining the coolant servicing apparatus disclosed herein. Referring to FIGS. 12 & 12A collectively, the apparatus draining operation 1200 begins by connecting a drain hose 725 to the outlet of solenoid-operated coolant control valve S1 1205. Main power to the apparatus is turned ON 1210 and the compressor 770 is activated 1215. Solenoid-operated control valves S6, S5 and S1 are opened 1220 and processing waits a period of time to effectuate draining of the apparatus 1225. By way of experimentation, this period of time may be readily determined. In one embodiment, three minutes may be sufficient to drain coolant tank 710. After draining the coolant tank, coolant control valve S2 is opened 1230 and control valve S5 is closed 1235. This forces compressed air through coolant supply line 730 to drain the coolant therefrom. Processing waits a period of time 1240 (for example, 30 seconds), and then opens coolant control valve S3 to force compressed air through the coolant supply line containing the particulate filter 1245. Coolant control valve S2 is closed 1250 and processing waits (for example, 30 seconds) 1255, to clear coolant from this coolant supply line 740. Coolant control valve S4 is then opened 1260 and coolant control valve S3 is closed 1265. This clears the coolant from the bypass coolant supply line 750 after a few seconds. After clearing the multiple parallel-connected coolant supply lines, the air compressor is turned OFF 1270, and control valves S6, S4 and S1 are closed 1275. Main power to the apparatus is turned OFF 1280 and the drain hose is disconnected from the outlet of coolant flow control valve S1 1285, which completes apparatus draining 1290.

Figure 13:
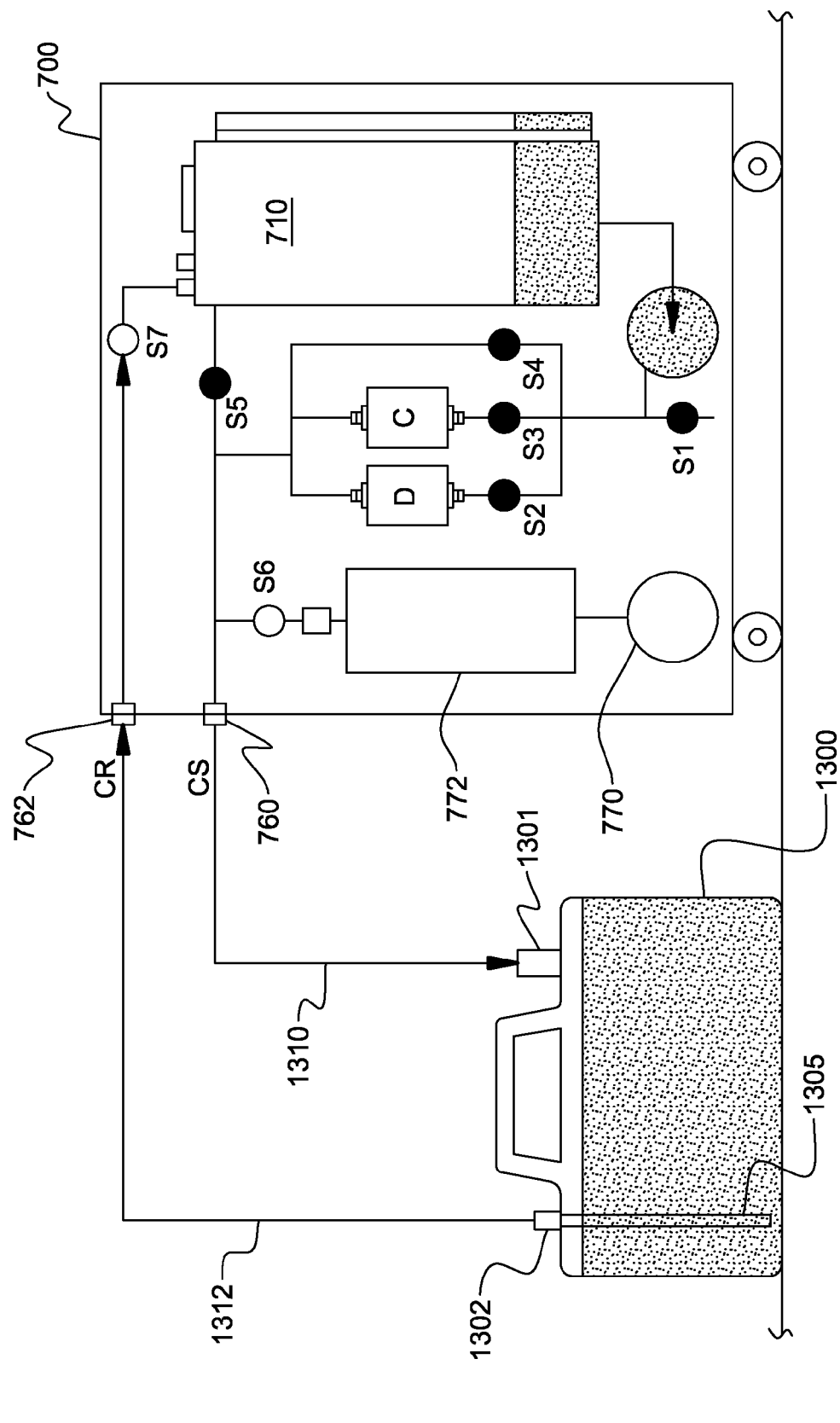
FIG. 13 illustrates an alternate approach to filling of the coolant servicing apparatus, in accordance with an aspect of the present invention.

FIG. 13 illustrates an alternate embodiment of a technique for filling the coolant servicing apparatus 700, in accordance with an aspect of the present invention. In this approach, a coolant shipping container 1300 is employed in filling coolant servicing apparatus 700. As one example, coolant shipping container 1300 may be approximately a five gallon container, with about four gallons of coolant disposed within the container. Coolant shipping container 1300 includes an inlet port 1301 and an outlet port 1302 in fluid communication with the interior of the container. As illustrated, outlet port 1302 is coupled to a coolant transfer pipe 1305 which extends down to a lower portion of coolant shipping container 1300. Depending on the volume of coolant required to fill the cooling system to be charged, two or more coolant shipping containers 1300 may be employed, for example, at a customer location. In one detailed example, the coolant shipping container 1300 could contain pure water packaged at a centralized facility and shipped to the customer location for use in filling the cooling system to be charged.

At the customer location, coolant shipping container 1300 is connected to the coolant servicing apparatus 700 via, for example, two flexible hoses 1310, 1312, each of which includes quick connect couplings on each end. Flexible hose 1310 functions as an air pressurization line and is connected between coolant supply port 760 of coolant serving apparatus 700 and inlet port 1301 of coolant shipping container 1300, again, using quick connect couplings at each connection. Flexible hose 1312 functions as a coolant transfer line and is connected to coolant return port 762 of coolant servicing apparatus 700 and outlet port 1302 of coolant shipping container 1300.

To perform the coolant transfer operation, after connecting hoses, main power to coolant serving apparatus 700 is turned ON, and air compressor 770 is turned ON, forcing air into air holding tank 772. Airflow control valve S6 is opened, as well as coolant control valve S7, which opens the return line to coolant tank 710. As pressure builds up in the upper portion of coolant shipping container 1300, coolant (e.g., water) is forced into coolant transfer pipe 1305 and up into flexible hose 1312 and then into coolant tank 710 within the coolant servicing apparatus. Once the coolant has been transferred from coolant shipping container 1300 to coolant servicing apparatus 700, air compressor 770 is turned OFF, flow control valves S6 and S7 are closed, main power is turned OFF, and the flexible hoses 1310, 1312 are disconnected from both the coolant shipping container 1300 and the coolant servicing apparatus 700. As noted, the process can be repeated using one or more additional coolant shipping containers 1300, as necessary to achieve a desired amount of coolant charge within the coolant servicing apparatus for filling of a cooling system.

Those skilled in the art will note from the above description that various aspects of the coolant control valve operations and protocol depicted in the figures may be automated by provision of an appropriate controller disposed, for example, within the coolant servicing apparatus, and the use of solenoid-operated control valves coupled to the controller.

More particularly, the detailed description presented above is discussed in terms of procedures which can be executed on a computer, a network or a cluster of computers. These procedural descriptions and representations are used by those skilled in the art to most effectively convey the substance of their work to others skilled in the art. They may be implemented in hardware or software, or a combination of the two.

A procedure is here, and generally, conceived to be a sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as closing or opening, which are commonly associated with manual operations performed by a human operator. No such intervention of a human operator is necessary in the operations described herein which form part of the present invention; the operations may be implemented as automatic machine operations. Useful machines for performing the operations of the present invention include general purpose digital computers or similar devices.

Aspects of the invention are preferably implemented in a high level procedural or object-oriented programming language to communicate with a computer. However, the inventive aspects can be implemented in assembly or machine language, if desired. In any case, the language may be a compiled or interpreted language.

The invention may be implemented as a mechanism or a computer program product comprising a recording medium. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of a general or special purpose programmable computer according to the method of the invention and/or to structure its components in accordance with a system of the invention.

Aspects of the invention may be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another environment (such as a partially clustered computing environment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computing environment. The required structure for a variety of these systems will appear from the description given.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of servicing a cooling system of a liquid-cooled electronics rack, the method comprising:
    filling a cooling system of a liquid-cooled electronics rack employing a coolant servicing apparatus, the electronics rack comprising at least one electronics subsystem cooled by the cooling system, the cooling system employing liquid coolant and comprising multiple air-vent ports, and wherein the coolant servicing apparatus comprises:
        a coolant tank;
        a coolant pump in fluid communication with the coolant tank for pumping coolant therefrom;
        at least one coolant supply line coupling the coolant pump to a coolant supply port of the apparatus, each coolant supply line of the at least one coolant supply line including a coolant control valve for selectively controlling flow of coolant therethrough pumped by the coolant pump from the coolant tank to the coolant supply port of the apparatus;
        a coolant return port, and a coolant return line coupled between the coolant return port and the coolant tank, the coolant return line including a coolant control valve for controlling flow of return coolant therethrough; and
        an air-vent line connected to an upper portion of the coolant tank, the air-vent line comprising a flexible tube sized to allow selective coupling thereof to the multiple air-vent ports of the cooling system of the liquid-cooled electronics rack;
    and wherein the filling comprises employing the coolant servicing apparatus to fill the cooling system, the employing comprising:
        connecting the air-vent line to one vent port of the multiple air-vent ports of the cooling system;
        closing the coolant control valve of the coolant return line;
        pumping coolant via the coolant supply port into the cooling system;
        waiting at least a first period of time;
        determining whether air is present in the air-vent line, and if so, opening the coolant control valve in the coolant return line to allow coolant to circulate back to the coolant servicing apparatus from the cooling system through the coolant return port, and waiting at least a second period of time before again closing the coolant control valve of the coolant return line to prevent coolant return into the coolant tank through the coolant return port, again waiting at least the first period of time, and checking to determine whether air is present in the air-vent line, and if so, repeating the determining;
        otherwise, opening the coolant control valve in the coolant return line to allow return of coolant from the cooling system into the coolant tank therethrough, and disconnecting the air-vent line from the one air-vent port of the multiple air-vent ports of the cooling system of the electronics rack, and connecting the air-vent line to another air-vent port of the multiple air-vent ports of the cooling system; and
        repeating the closing, the waiting, the determining, the opening, the disconnecting and the connecting until each air-vent port of the multiple air-vent ports of the cooling system has been bled of air, thereby facilitating filling of coolant into the cooling system of the liquid-cooled electronics rack.

2. The method of claim 1, wherein the coolant servicing apparatus further comprises multiple parallel-connected coolant supply lines coupling the coolant pump to the coolant supply port of the coolant servicing apparatus, each coolant supply line of the multiple parallel-connected coolant supply lines including a coolant control valve for selectively controlling flow of coolant therethrough pumped by the coolant pump from the coolant tank to the coolant supply port of the coolant servicing apparatus, wherein at least one coolant supply line of the multiple parallel-connected coolant supply lines includes at least one filter, and wherein one coolant supply line of the multiple parallel-connected coolant supply lines is a bypass coolant supply line with no filter, and wherein the method further comprises initially connecting the cooling system in fluid communication with the coolant supply port and with the coolant return port to facilitate pumping of coolant through the cooling system from the coolant servicing apparatus, and pumping coolant through the cooling system employing the coolant servicing apparatus for at least a third period of time prior to connecting the air-vent line to the one vent port of the multiple vent ports of the cooling system.

3. The method of claim 2, wherein the pumping further comprises pumping coolant through a coolant particulate filter disposed within one coolant supply line of the multiple parallel-connected coolant supply lines for the at least the third period of time.

4. The method of claim 2, wherein a first coolant supply line of the multiple parallel-connected coolant supply lines includes a deionization filter and a first coolant control valve coupled in-series, and a second coolant supply line of the multiple parallel-connected coolant supply lines includes a particulate filter and a second coolant control valve coupled in-series, and wherein the bypass coolant supply line includes a bypass coolant control valve, and wherein the method further comprises after the multiple air-vent ports of the cooling system have been bled of air:
    circulating coolant fed from the coolant servicing apparatus to the cooling system through the first coolant supply line, including the deionization filter for deionizing the coolant, the circulating continuing for a fourth period of time until coolant has circulated through the cooling system and the coolant servicing apparatus at least once.

5. The method of claim 3, wherein the coolant is water and the method further comprises placing a BTA charge within the coolant tank and circulating the water-BTA solution through the cooling system and the coolant servicing apparatus for a fifth period of time to ensure that the water-BTA solution has passed into the cooling system, and thereafter, disconnecting the coolant servicing apparatus from the cooling system.

6. The method of claim 2, further comprising filling the coolant servicing apparatus prior to filling of the cooling system, wherein filling the coolant serving apparatus comprises:
    placing coolant into the coolant tank;

circulating coolant pumped by the coolant pump from the coolant tank through one coolant supply line of the multiple parallel-connected coolant supply lines, the one coolant supply line comprising a particulate filter; and after circulating all coolant within the coolant tank at least once through the particulate filter, circulating coolant within the coolant tank through another coolant supply line of the multiple parallel-connected coolant supply lines, the another coolant supply line comprising a deionization filter, and after circulating all coolant within the coolant tank through the deionization filter, proceeding with filling of the cooling system employing the coolant servicing apparatus.

7. The method of claim 1, wherein the coolant servicing apparatus further comprises a pressurized air source connected for selective provision of pressurized airflow to the coolant supply port of the apparatus, and wherein the method further comprises filling the coolant servicing apparatus prior to filling of the cooling system, wherein filling the coolant servicing apparatus comprises obtaining a coolant shipping container containing coolant for the coolant servicing apparatus, and employing the pressurized air source to pump coolant from the coolant shipping container into the coolant tank of the coolant servicing apparatus.

8. The method of claim 7, further comprising connecting an air pressure line between the coolant supply port of the coolant servicing apparatus and an inlet port of the coolant shipping container, and connecting a coolant transfer line between an outlet port of the coolant shipping container and the coolant return port of the coolant servicing apparatus, and wherein the pressurized air source comprises a series-connected air compressor, air holding tank, air pressure regulator and airflow control valve, the series-connected air compressor, air holding tank, air pressure regulator and airflow control valve being connected for selective provision of airflow to the coolant supply port of the coolant servicing apparatus for facilitating filling of the coolant servicing apparatus by pressurized air forcing of coolant from the coolant shipping container into the coolant tank of the coolant servicing apparatus.

9. A method of servicing a cooling system of a liquid-cooled electronics rack, the method comprising:
  obtaining a coolant servicing apparatus comprising:
    a coolant tank;
    a coolant pump in fluid communication with the coolant tank for pumping coolant therefrom;
    a coolant supply port, and at least one coolant supply line coupling the coolant pump to the coolant supply port of the apparatus, each coolant supply line of the at least one coolant supply line including a coolant control valve for controlling flow of coolant therethrough pumped by the coolant pump from the coolant tank to the coolant supply port of the apparatus;
    a coolant return port, and a coolant return line coupled between the coolant return port and the coolant tank, the coolant return line including a coolant control valve for controlling flow of return coolant therethrough; and
    a pressurized air source connected for selective provision of pressurized air flow to the coolant supply port of the apparatus for facilitating draining of coolant from the cooling system of the liquid-cooled electronics rack using the apparatus; and
  wherein the method further comprises:
    employing the coolant servicing apparatus to one of fill a cooling system of a liquid-cooled electronics rack or drain the cooling system of the liquid-cooled electronics rack, wherein filling the cooling system comprises connecting at least one first port of the cooling system to the coolant supply port of the coolant servicing apparatus and connecting at least one second port of the cooling system to the coolant return port of the coolant servicing apparatus, and pumping coolant via the coolant supply port from the coolant servicing apparatus into the cooling system and back to the coolant return port for a period of time sufficient to ensure filling of the cooling system with coolant, and wherein draining coolant from the cooling system comprises connecting the at least one first port of the cooling system to the coolant supply port of the coolant servicing apparatus and connecting the at least one second port of the cooling system to the coolant return port of the coolant servicing apparatus, and employing the pressurized air source to force air from the coolant servicing apparatus via the coolant supply port into the cooling system for a period of time sufficient to drain a majority of coolant from the cooling system into the coolant servicing apparatus.

10. The method of claim 9, further comprising employing the coolant servicing apparatus to selectively filter coolant within the cooling system of the liquid-cooled electronics rack, wherein one coolant supply line of the at least one coolant supply line includes a filter and a coolant control valve, and wherein the employing comprises connecting the at least one first port of the cooling system to the coolant supply port of the coolant servicing apparatus and connecting the at least one second port of the cooling system to the coolant return port of the coolant servicing apparatus, and opening the coolant control valve of the one coolant supply line to allow flow of coolant through the filter while pumping coolant from the coolant servicing apparatus into the cooling system and back to the coolant servicing apparatus to achieve filtering of coolant within the cooling system.

11. The method of claim 10, wherein the coolant is water and the filter is a deionization filter.

12. The method of claim 9, wherein the pressurized air source comprises a series-connected air compressor, air holding tank, air pressure regulator and air flow control valve, the series-connected air compressor, air holding tank, air pressure regulator and air flow control valve being connected for selective provision of pressurized air to the coolant supply port of the apparatus, and wherein when draining coolant from the cooling system, the employing further comprises opening an access cover of the coolant tank prior to turning on the air compressor to facilitate pumping of air into the cooling system, and wherein during draining of coolant from the cooling system, the coolant pump is turned off.

13. The method of claim 9, wherein the pressurized air source comprises a series-connected air compressor, air holding tank, air pressure regulator and air flow control valve, the series-connected air compressor, air holding tank, air pressure regulator and air flow control valve being connected for selective provision of pressurized air to the coolant supply port of the apparatus, and wherein the method further comprises draining the coolant servicing apparatus after employing the coolant servicing apparatus to one of fill the cooling system or drain the cooling system, wherein draining the coolant servicing apparatus comprises:
  opening a coolant drain line coupled to the coolant pump and activating the air compressor to pump air from the air compressor into the coolant tank to force coolant through the coolant pump and out the coolant drain line; and
  draining coolant from the at least one coolant supply line coupling the coolant pump to the coolant supply port by pumping air from the air compressor into the at least one coolant supply line to force coolant therein out the coolant drain line.

14. The method of claim 9, wherein the coolant servicing apparatus further comprises a housing, and the coolant supply port and the coolant return port are disposed at an outer wall of the housing.

15. A method of servicing a cooling system of a liquid-cooled electronics rack, the method comprising:
  obtaining a coolant servicing apparatus comprising:
    a coolant tank;
    a coolant pump in fluid communication with the coolant tank for pumping coolant therefrom;
    a coolant supply port, and at least one coolant supply line coupling the coolant pump to the coolant supply port of the apparatus, each coolant supply line of the at least one coolant supply line including a coolant control valve for controlling flow of coolant therethrough pumped by the coolant pump from the coolant tank to the coolant supply port of the apparatus;
    a coolant return port, and a coolant return line coupled between the coolant return port and the coolant tank, the coolant return line including a coolant control valve for controlling flow of return coolant therethrough; and
    a pressurized air source connected for selective provision of pressurized air flow to the coolant supply port of the apparatus for facilitating draining of coolant from the cooling system of the liquid-cooled electronics rack using the apparatus; and
  wherein the method further comprises:
    employing the coolant servicing apparatus to fill a cooling system of a liquid-cooled electronics rack, wherein filling the cooling system comprises connecting at least one first port of the cooling system to the coolant supply port of the coolant servicing apparatus and connecting at least one second port of the cooling system to the coolant return port of the coolant servicing apparatus, and pumping coolant from the coolant servicing apparatus, via the coolant supply port, into the cooling system and back to the coolant return port of the coolant servicing apparatus for a period of time sufficient to ensure filling of the cooling system with coolant.

* * * * *